United States Patent
Zhang et al.

(10) Patent No.: US 8,509,276 B2
(45) Date of Patent: Aug. 13, 2013

(54) PLASMON LASERS AT DEEP SUBWAVELENGTH SCALE

(71) Applicant: The Regents of the University of California, Oakland, CA (US)

(72) Inventors: Xiang Zhang, Alamo, CA (US); Volker Jendrik Sorger, Berkeley, CA (US); Rupert Francis Maximillian Oulton, El Cerrito, CA (US); Ren-Min Ma, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/668,248

(22) Filed: Nov. 3, 2012

(65) Prior Publication Data
US 2013/0148682 A1    Jun. 13, 2013

Related U.S. Application Data

(63) Continuation of application No. PCT/US2011/045633, filed on Jul. 27, 2011.

(60) Provisional application No. 61/367,924, filed on Jul. 27, 2010.

(51) Int. Cl.
*H01S 5/00* (2006.01)

(52) U.S. Cl.
USPC ........... 372/45.01; 372/46.01; 372/44.01; 372/43.01

(58) Field of Classification Search
USPC ............ 372/45.01, 56.01, 44.01, 43.01
See application file for complete search history.

(56) References Cited

U.S. PATENT DOCUMENTS

| 5,555,255 | A | 9/1996 | Kock | |
|---|---|---|---|---|
| 6,301,282 | B1 | 10/2001 | Capasso | |
| 6,501,783 | B1* | 12/2002 | Capasso et al. | 372/96 |
| 7,010,183 | B2* | 3/2006 | Estes et al. | 385/14 |
| 2001/0009541 | A1 | 7/2001 | Ueyanagi | |
| 2007/0280319 | A1* | 12/2007 | Sekiguchi et al. | 372/45.01 |
| 2009/0279085 | A1 | 11/2009 | Ebstein | |

OTHER PUBLICATIONS

Korean Intellectual Property Office, International Search Report and Written Opinion issued on Apr. 27, 2012 for corresponding International Patent Application No. PCT/US2011/045633 (pp. 1-8), with claims searched (pp. 9-13) pp. 1-13.

* cited by examiner

*Primary Examiner* — Kinam Park
(74) *Attorney, Agent, or Firm* — John P. O'Banion

(57) ABSTRACT

Hybrid plasmonic waveguides are described that employ a high-gain semiconductor nanostructure functioning as a gain medium that is separated from a metal substrate surface by a nanoscale thickness thick low-index gap. The waveguides are capable of efficient generation of sub-wavelength high intensity light and have the potential for large modulation bandwidth >1 THz.

29 Claims, 19 Drawing Sheets

PLASMON LASERS AT DEEP SUBWAVELENGTH SCALE

CROSS-REFERENCE TO RELATED APPLICATIONS

This application is a 35 U.S.C. §111(a) continuation of PCT international application number PCT/US2011/045633 filed on Jul. 27, 2011, incorporated herein by reference in its entirety, which is a nonprovisional of U.S. provisional patent application Ser. No. 61/367,924 filed on Jul. 27, 2010, incorporated herein by reference in its entirety. Priority is claimed to each of the foregoing applications.

The above-referenced PCT international application was published as PCT International Publication No. WO 2012/015990 on Feb. 2, 2012 and republished on Jun. 21, 2012, and is incorporated herein by reference in its entirety.

STATEMENT REGARDING FEDERALLY SPONSORED RESEARCH OR DEVELOPMENT

This invention was made with Government support under Grant No. 67N-1069929 awarded by the Air Force Office of Scientific Research (AFOSR) MURI and Grant No. CMMI-0751621 awarded by the National Science Foundation Nanoscale Science and Engineering Center (NSF-NSEC). The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to laser light sources, and more particularly to plasmon laser light sources.

2. Description of Related Art

Laser science has been successful in producing increasingly high-powered, faster and smaller coherent light sources. Examples of recent advances are microscopic lasers that can reach the diffraction limit, based on photonic crystals (Altug, H., Englund, D. & Vuckovic, J. Ultrafast photonic crystal nanocavity laser. Nature Phys. 2, 484-488 (2006)), metal-clad cavities (Hill, M. T. et al. Lasing in metallic-coated nanocavities. Nature Photon. 1, 589-594)), and nanowires (Johnson, J. C. et al. Single gallium nitride nanowire lasers. Nature Mater. 1, 106-110, Duan, X., Huang, Y., Agarwal, R. & Lieber, C. M. Single-nanowire electrically driven lasers. Nature 421, 241-245 (2003)).

However, such lasers are restricted, both in optical mode size and physical device dimension, to being larger than half the wavelength of the optical field, $\lambda/2$ (see Bergman, D. J. & Stockman, M. I. Surface plasmon amplification by stimulated emission of radiation: quantum generation of coherent surface plasmons in nanosystems. Phys. Rev. Lett. 90, 027402 (2003), Zheludev, N. I., Prosvirnin, S. L., Papasimakis, N. & Fedotov, V. A. Lasing spaser. Nature Photon. 2, 351-354 (2008)), which illustrate the current understanding in the art that it is a fundamental physical limit of optics that the optical mode size is limited to $\lambda/2$ (see Eugene Hecht, "Optics," Addison Wesley (1987)). It therefore remains a key fundamental challenge to realize ultra-compact lasers that can directly generate coherent optical fields at the nanometer scale, which is far beyond the diffraction limit.

One way of addressing this issue is to make use of surface plasmons which are capable of tightly localizing light. However, ohmic losses at optical frequencies have inhibited the realization of truly nanometer-scale lasers based on such approaches (see Ambati, M. et al. Observation of stimulated emission of surface Plasmon polaritons. Nano Lett. 8, 3998-4001 (2008), Noginov, M. A. et al. Stimulated emission of surface plasmon polaritons. Phys. Rev. Lett. 101, 226806 (2008)).

Accordingly, an object of the present invention is a plasmon light source capable of a confined generation of sub-wavelength scale or sized high intensity light.

BRIEF SUMMARY OF THE INVENTION

An aspect of the present invention is a nanometer scale semiconductor laser source for on-chip integration. The laser can be very compact, with typical device dimensions of 50-200 nm×50-200 nm×2-20 µm. The device is capable of efficient generation of sub-wavelength high intensity light and the potential for large modulation bandwidth >1 THz.

The high efficiency and compact dimensions are achieved by the laser action of optical modes bound between the surface of a metal and a semiconductor structure. These optical modes have dimensions more than an order of magnitude smaller than the wavelength of the light, leading to intense optical fields on the nano-meter scale. The light source of the present invention may be employed to sense and detect ultra-small quantities of biomolecular species, and provide superior sensitivity and with lower power consumption. In addition, the device of the present invention is capable of fast laser modulation speed, and can be modulated up to at least 10 THz, providing unprecedented data bandwidth.

Nanometer-scale plasmonic lasers are shown generating optical modes a hundred times smaller than the diffraction limit of light. In one embodiment, hybrid plasmonic waveguides comprise a high-gain cadmium sulphide semiconductor nanowire that is separated from a silver surface by a 5-nm thick insulating gap. Direct measurements of the emission lifetime reveal a broad-band enhancement of the nanowire's exciton spontaneous emission rate by up to six times, due to strong mode confinement and the signature of threshold-less lasing. Because plasmonic modes of the devices of the present invention have no cutoff, downscaling of the lateral dimensions of both the device and the optical mode have been shown. The plasmonic lasers of the present invention thus allow for study of extreme interactions between light and matter, with particular applicability in the fields of active photonic circuits, bio-sensing, and quantum information technology.

The present invention uses surface plasmon polaritons to overcome the well established diffraction limit of conventional optics via the compact storage of optical energy in electron oscillations at the interfaces of metals and dielectrics. The subwavelength optical length scales allows for compact optical devices with new functionalities by enhancing inherently weak physical processes, such as fluorescence and Raman scattering of single molecules and nonlinear phenomena.

The optical source of the present invention couples electronic transitions directly to strongly localized optical modes, and avoids the common limitations of delivering light from a macroscopic external source to the nanometer scale (e.g. low coupling efficiency and difficulties in accessing individual optical modes).

Various applications of the system of the present invention, include, but are not limited to, (i) a sub-wavelength light source capable of focusing and sustaining input optical or electrical power to below the diffraction limit; (ii) integration with existing silicon photonic systems to provide new functionality including: nano-scale optical logic, enhanced non-linear effects for switching and optical processing; (iii) the basis for new ultra-sensitive detectors operating at the single molecule level, by utilizing enhanced light matter interactions within the confined environment.

Furthermore, electrical pumping means may be used such that a small voltage (e.g. <5V) may be applied to drive pumping of the laser.

In one embodiment, an electrically driven plasmon nanowire laser is disclosed.

In another embodiment, plasmon nanowire laser with a light emitting tunnel junction is disclosed.

An aspect of the invention is a plasmon laser source, comprising a metal substrate, a semiconductor separated from a surface of the metal substrate by a low-refraction index gap, and an electron pumping means. The electron pumping means is configured to excite an electron carrier population to generate a plasmonic laser emission from the low-refraction index gap. The plasmonic laser emission is confined by a plasmonic mode having a mode size smaller than the diffraction limit of light in at least one dimension.

Another aspect of the invention is method for generating a plasmonic emission having a mode size smaller than the diffraction limit of light, the method comprising the steps of: generating an electrical bias across a metal substrate and a semiconductor material separated from a surface of the metal substrate by a low-refraction index gap; and exciting an electron carrier population within the semiconductor material to generate the plasmonic emission from the low-refraction index gap.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
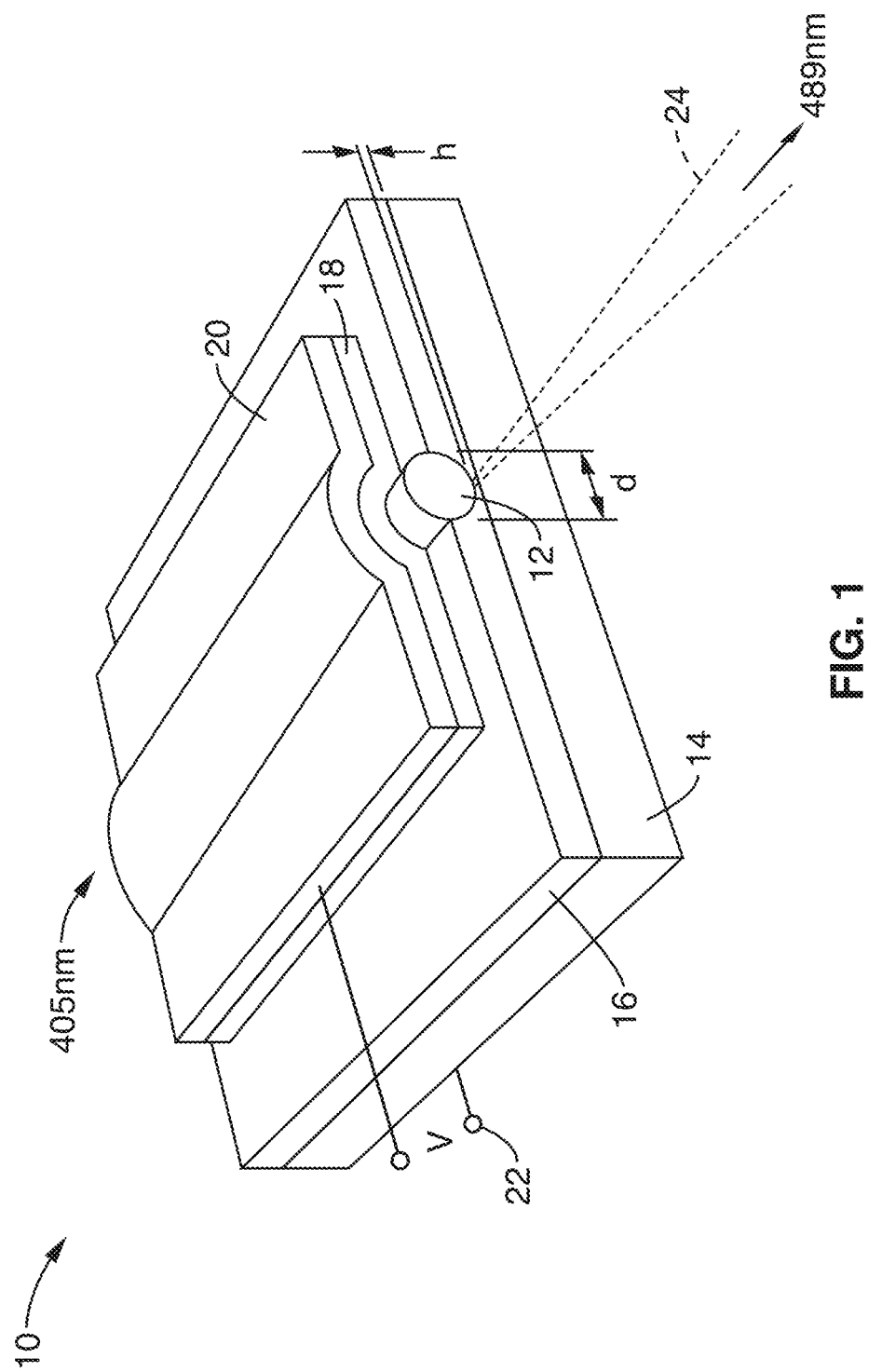
FIG. 1 shows a schematic cut-out view of a light source of the present invention having a hybrid plasmonic waveguide formed from a high-gain semiconductor nanowire.
Figure 4A:
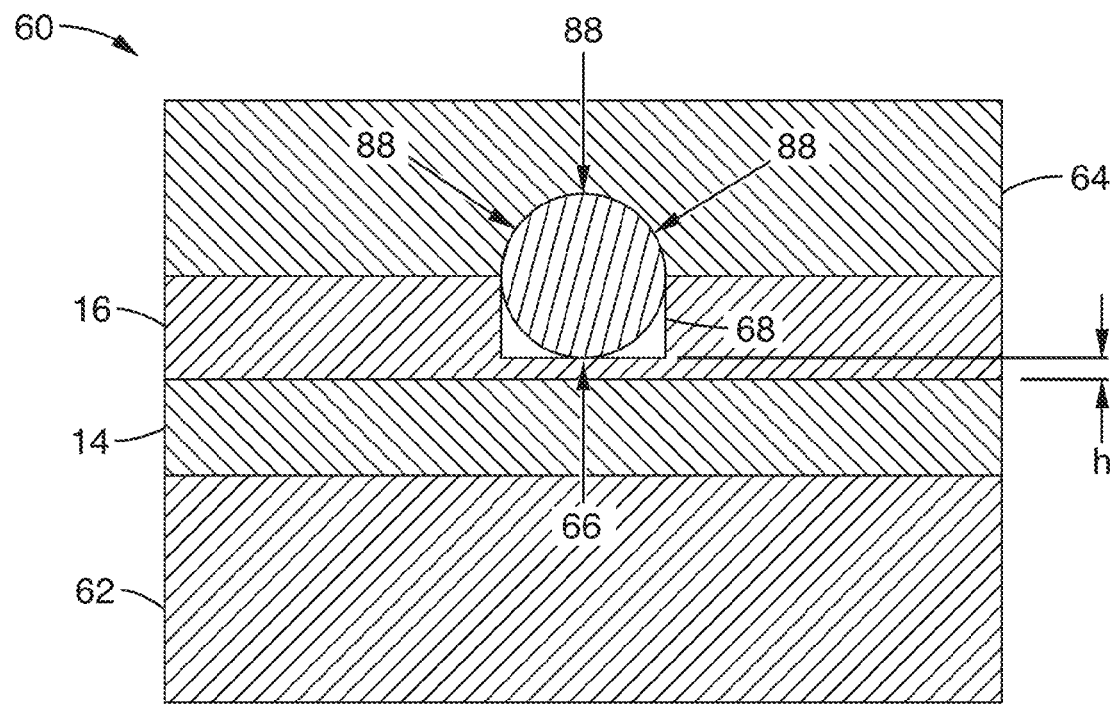
FIG. 4A shows a hybrid plasmon laser having a hole injection layer disposed over semiconductor nanowire.
Figure 4B:
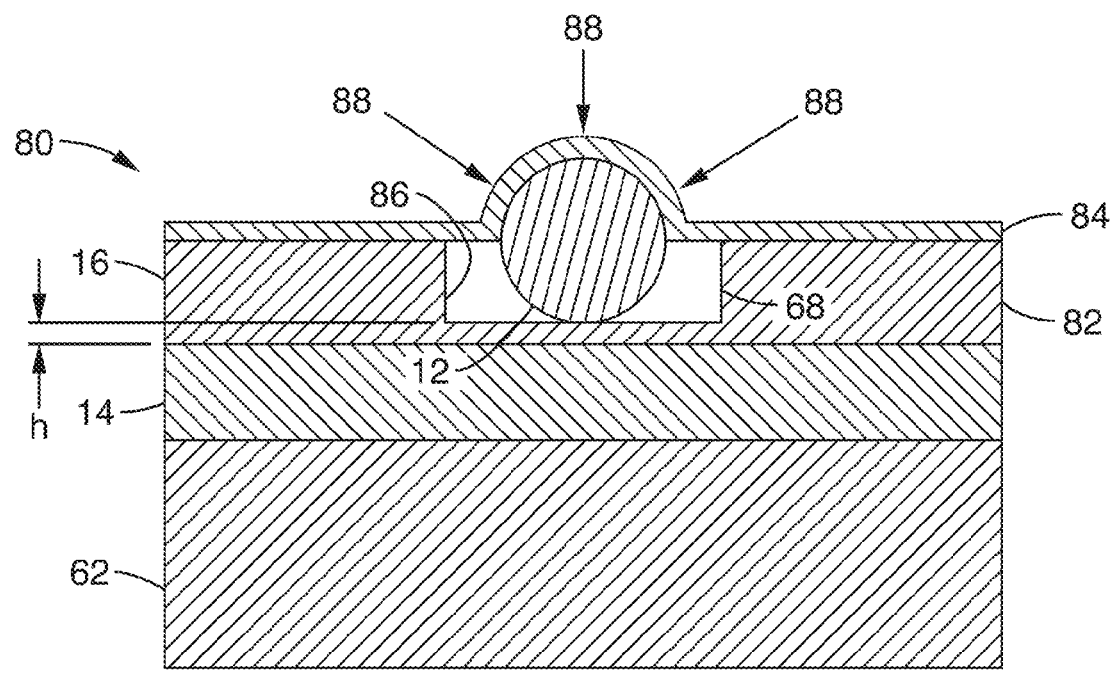
FIG. 4B shows schematic view of a hybrid plasmon laser having a Graphene hole injection layer disposed over semiconductor nanowire.
Figure 5:
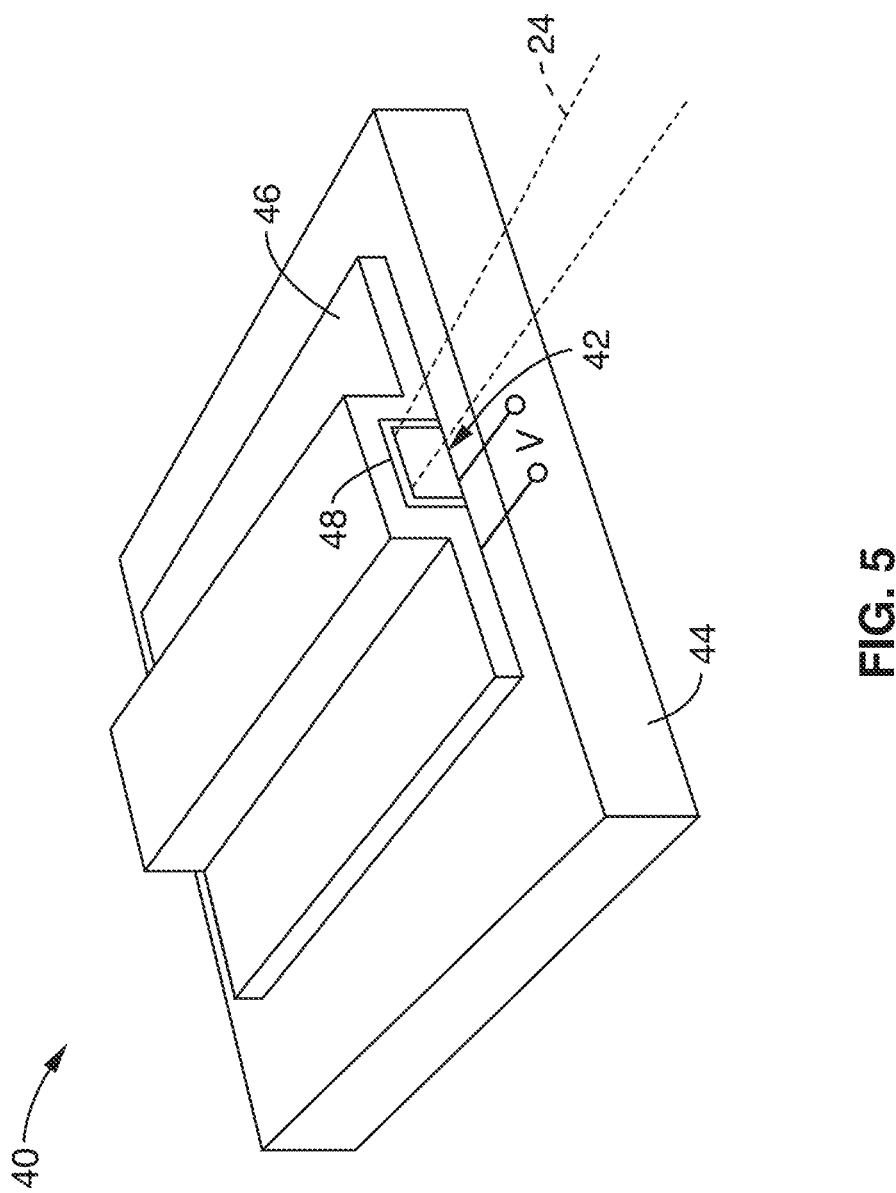
FIG. 5 shows a schematic diagram of an alternative plasmon laser based on a metal-oxide-semiconductor (MOS) tunnel junction utilizing a Silicon-on-Insulator (SOI) architecture.

FIG. 1 and FIG. 5 illustrate schematic diagrams of two electrically-pumped nanowire plasmonic lasers in accordance with the present invention. The devices illustrated in FIG. 1 through FIG. 5 utilize hybridizing dielectric waveguiding with plasmonics, in which a semiconductor gain medium is separated from a metallic surface by a nanometer scale insulating gap. The coupling between the plasmonic and waveguide modes across the gap enables energy storage in nonmetallic regions. This hybridization allows surface plasmon polaritons to travel over larger distances with strong mode confinement and the integration of a high-quality semiconductor gain material with the confinement mechanism itself. The 'hybrid plasmonics' described below were shown experimentally to generate laser action of surface plasmon polaritons with mode areas at least as small as $\lambda^2/400$ (or $\lambda/20$ in at least one dimension).

FIG. 1 shows a schematic cut-out view of a light source 10 comprising a hybrid plasmonic waveguide formed from a high-gain semiconductor nanowire 12 that functions as a gain medium, which is disposed a specified distance h from a metallic substrate 14. The semiconductor gain medium 12 generally comprises a high-refractive index material, and preferably comprises a refractive index of between 2.5 and 3.5.

A gap layer 16 is disposed between the metal substrate 14 and semiconductor gain medium 12. Gap layer 16 preferably comprises a low-refractive index material, (e.g. having a refractive index of 1.0-2.0), such that there is a significant change in refractive index between the semiconductor gain medium 12 and the gap layer 16. For example, the change in refractive index A may range between approximately 0.5 and approximately 2.5. An exemplary gap material may comprise an oxide or similar material. In an alternative embodiment (not shown), the gap layer 16 may comprise a support that suspends the nanowire gain medium 12 above the metallic substrate 14 (thus the low index material being air, with an index of 1).

While semiconductor gain medium 12 is shown in FIG. 1 as a circular cross-section, it is appreciated that the nanowire may comprise any shape, (e.g. hexagonal, rectangular, etc.). It is also appreciated that while the semiconductor gain medium 12 preferably comprises nanometer scale as found in nanowires, however the nanostructure of gain medium 12 may be generated via any means available in the art, and is not restricted to synthesis methods generally associated with nanowire generation.

Gap layer 16 preferably comprises a thickness h sized to promote injection of tunneling electrons (e⁻) from the metallic substrate 14 to the semiconductor nanowire gain medium 12. As will be explained in further detail below, the gap layer thickness h also drives the nanoscale optical mode of the laser light source 10. Preferably, the gap layer thickness h ranges between approximately 1 nm and approximately 100 nm, and more preferably between approximately 2 nm and approximately 50 nm, and more preferably between approximately 5 nm and approximately 10 nm.

As seen in FIG. 1, the lower side of the semiconductor nanowire is partially encased within the low-index layer 16, and is covered on its upper side by a positive charge carrier (h⁺) or hole injection layer 18.

In a preferred embodiment, the laser light source 10 is configured to be electrically pumped such that an electrical bias 22 may be applied across the device (e.g. between metallic contact 20 and metallic substrate 14) to generate an electron carrier population (e⁻ and h⁺) to drive photon emission and lasing.

In an alternative embodiment, the laser light source 10 may be optically pumped (with a light of energies around the semiconductor bandgap utilized as the gain material of the laser, e.g. 405 nm light for the semiconductor CdS) to generate the charge carrier population (excitons, e⁻ and h⁺).

Whether optically or electrically pumped, the generated plasmons from the electron carrier population are substantially concentrated within the gap layer 16 between the surface of the metal substrate 14 and the gain medium 12, resulting in sub-wavelength mode laser emission 24. While the optical mode (herein defined as the confined cross-sectional region of the beam being emitted) is concentrated primarily at the gap layer 18, some of the mode is also emitted from the gain medium 12 (modal overlap, illustrated in FIG. 3), with a very small/negligible emission from the metal substrate 14. Thus, the size of the gap layer 16 corresponds to, and drives, the size of the plasmonic emission 24 mode (i.e. the mode will be slightly larger than gap size in at least one dimension (e.g. gap thickness h)), and thus can be used to dictate the optical mode size well below the diffraction limit.

The semiconductor nanowire 12, when positioned a few nanometers away from a metal surface 14, provides at least these functions; (i) it serves as the optical amplifier (gain medium) of the laser device 10, (ii) it provides a crucial part of the optical mode confinement mechanism and (iii) it constitutes the laser resonator (cavity) providing feedback.

Figure 2:
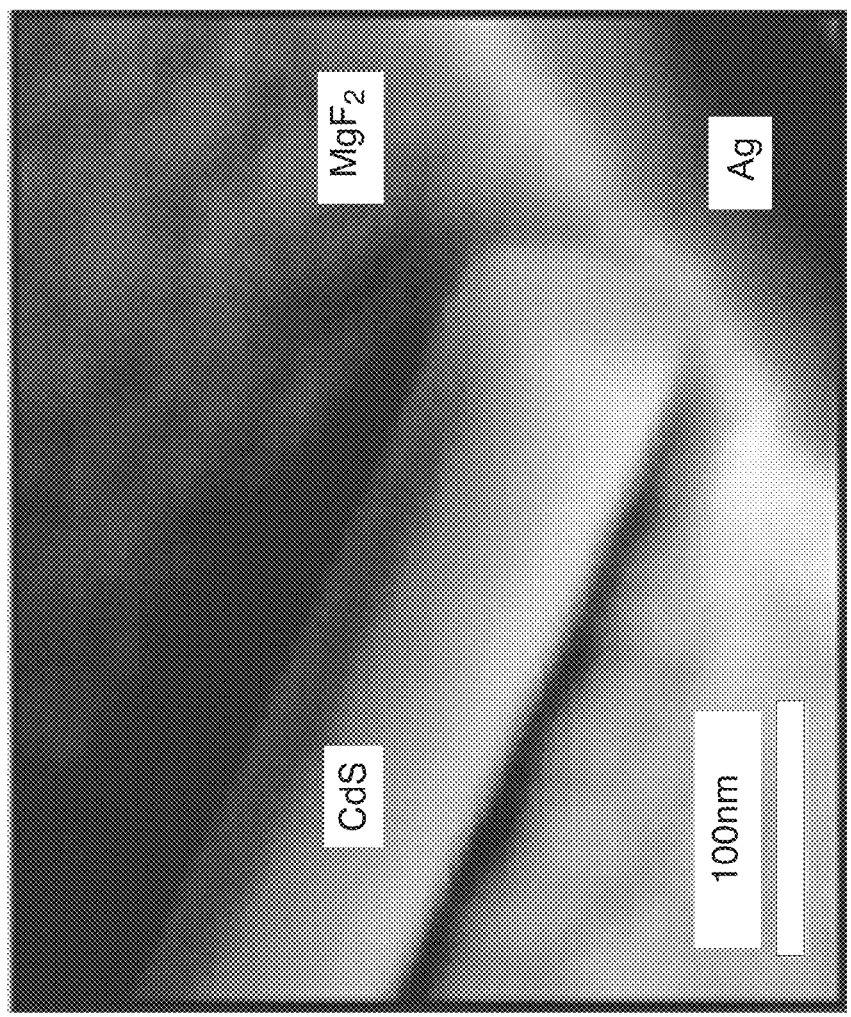
FIG. 2 shows an SEM image of a plasmonic laser generated in accordance with the present invention.

FIG. 2 shows an SEM image of a plasmonic laser generated in accordance with the present invention, which has been sliced perpendicular to the nanowire's axis to show the underlying layers. The laser comprises a high-gain cadmium sulphide (CdS) semiconductor nanowire separated from the surface of the silver (Ag) substrate by a magnesium fluoride $MgF_2$ (oxide) insulating layer having a gap of approximately 5 nm. The close proximity of the semiconductor and metal interfaces concentrates/confines light into the extremely small area of the gap, while harvesting gain from the nanowire.

Figure 3:
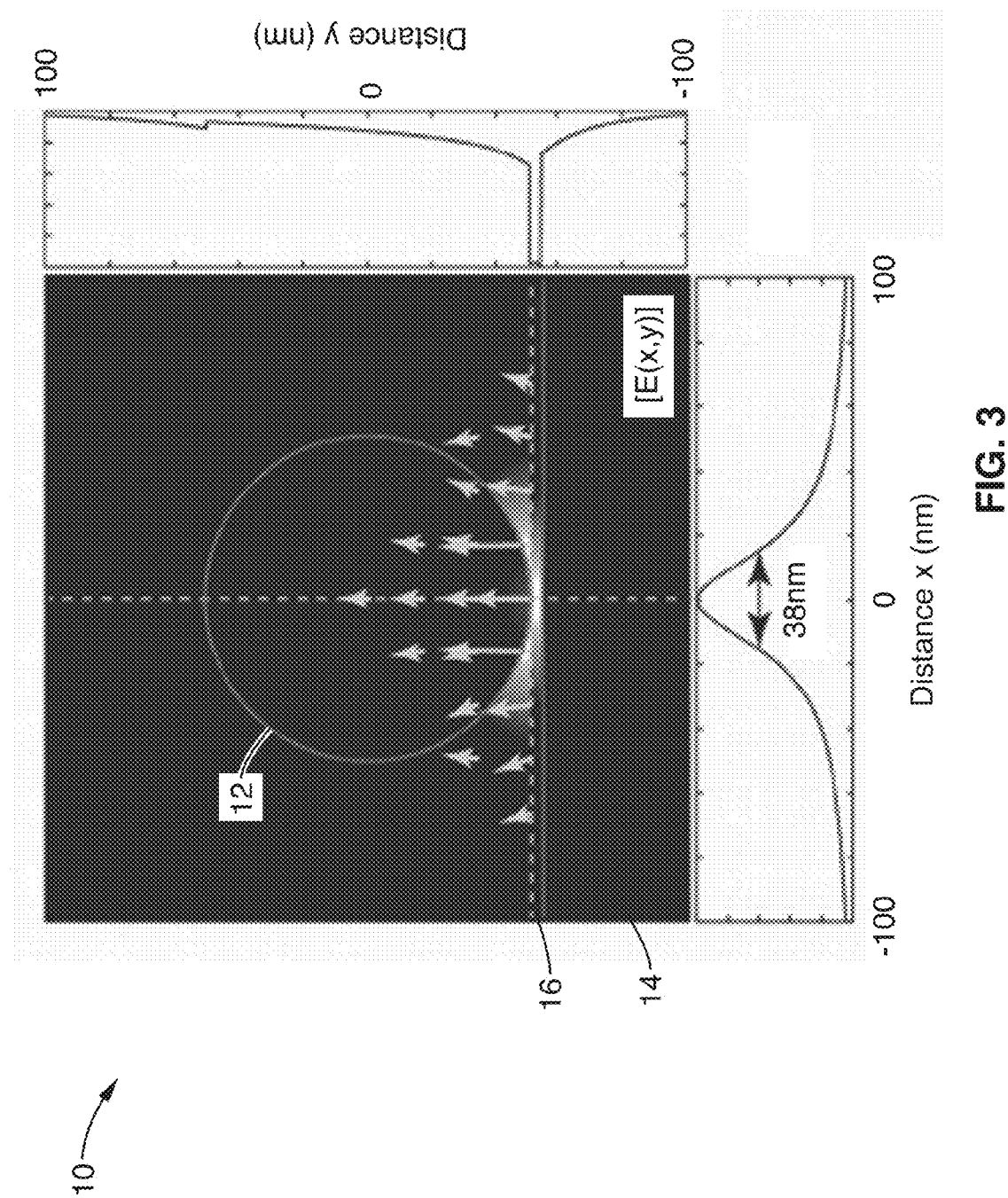
FIG. 3 illustrates a simulated electric field distribution and direction |E(x, y)| of a hybrid plasmonic mode at a wavelength of $\lambda=489$ nm, corresponding to the CdS $I_2$ exciton line.

FIG. 3 illustrates a simulated electric field distribution and direction $|E(x, y)|$ of a hybrid plasmonic mode at a wavelength of $\lambda=489$ nm, corresponding to the CdS $I_2$ exciton line. The cross-sectional field plots (along the broken lines in the field map) illustrate the strong overall confinement in the gap region 16 between the semiconductor nanowire 12 and metal surface 14, with sufficient modal overlap in the semiconductor nanowire 12 to facilitate gain.

It is appreciated that the wavelength ($\lambda=489$ nm) of emission 24 is a function of the selected gain material 12 (e.g. $\lambda=489$ nm is optimal for a CdS nanowire), and different gain materials may be selected as desired to generate a mode at a specified wavelength. Thus, the plasmon laser 10 may be designed over a broad band of wavelengths without affecting the mode size or loss/efficiency of the device.

FIGS. 4A and 4B illustrate cross-sectional schematic views of various nanowire plasmon laser, having different injection schemes in accordance with the present invention. FIG. 4A shows a hybrid plasmon laser 60 having a hole injection layer 64 disposed over semiconductor nanowire 12 and oxide layer 16. The oxide layer 16 comprises a channel 68 wherein the nanowire 12 (or other semiconductor gain medium nanostructure) is disposed. The channel 68 creates a thin gap h (e.g. 2 nm-10 nm) between the upper surface of the metal layer 14 and the semiconductor gain medium 12.

Via application of pumping means, such as an applied electrical bias or optical excitation light, tunnel currents 66 (e⁻) are carried through the thin gap h of gap layer 16 between the metal film 14 and the semiconductor nanowire 12 and can be quite large depending on the oxide gap thickness h and quality. For instance, $10^6$ Acm$^{-2}$ is achievable through 2.5 nm of native oxide on Silicon at 10 volts. While thermally evaporated oxide films provide the low refractive index preferred for the optical confinement, they can also achieve substantially higher tunnel currents than high-quality gate oxides.

It is appreciated that the tunneling scheme above with currents 66 (e⁻) is one means to pump the semiconductor material 12, which is generally fabrication/design specific. Other means may be available for pumping the laser without changing the underlying physics of the present invention, and it's benefits. For example, modulation of the laser may be achieved by crossing two semiconductor nanowires, whereas the one is used as an means to incject/deplete the carriers inside the laser cavity.

In one embodiment, hole injection layer 64 may comprise Indium-Tin-Oxide (ITO) to form a hole injection electrode (high work function) for injection of carrier electrons (h+) through the upper surface of device 60 without disrupting the sub-wavelength plasmon mode properties, which generally requires a low index, non-absorbing material.

FIG. 4B shows a schematic view of a hybrid plasmon laser 80 having a Graphene hole injection layer 84 disposed over semiconductor nanowire 12 and oxide layer 16. Since Graphene is of single atom thickness, it does not disturb the optical mode at all. Graphene is able to carry current densities as high as $10^5$ Acm$^{-2}$. Higher current densities may also be achieved using multiple layers of Graphene, without adversely affecting the optical mode.

In both embodiments, metal layer 14 may be further supported over substrate 62. Furthermore, to allow for electrical biasing, a top metal layer (not shown) may be positioned over injection layer 64/84 to provide electrical contact. Furthermore, channel 68 may conform to the shape of the semiconductor gain medium 12 (e.g. via mold or the like). While the cross-section of the nanowire 12 is shown as circular in FIG. 4A and FIG. 4B, it is also appreciated that the nanowire 12 may have a rectangular cross-sectional profile, thus matching the profile thickness of the gap 12. This allows for electron injection tunneling 66 through a larger portion of, or the entire width of, the channel 68. As shown in FIG. 4A and FIG. 4B, the electron injection tunneling is ideal at the apex of the nanowire 66, and then decreases exponentially outward toward the walls of the channel 66. Thus, the shape/size of the nanowire 12, along with the shape/size of the channel 68, may be varied to control the actual shape and size of the optical mode emission 24.

Other current leakage paths, for instance from the injection layer 64/84 through the oxide 16 to the underlying metal 14 are expected to be low.

The tunneling current density, J, scales proportional to $$J \sim \exp\{-\alpha \Phi^{0.5} h\},$$

where α approaches unity if the effective mass in the insulator equals the free electron mass, $\Phi = \chi_{semiconductor} - \chi_{oxide}$ and h the thickness in Angstroem. Thus, a 45 nm oxide gap thickness h has a tunnel probability of $10^{-450}$. However, film deposited with a physical vapor deposition (PVD) can have a lower density, leading to larger tunnel currents than in theoretical predictions than for the bulk material.

Based on threshold measurements in the optically pumped nanowire plasmon laser demonstrated below, a total laser loss off about 9000 cm-1 was estimated under maximum confinement (e.g. at gap size h of 5 nm). The equivalent electrical power density required for lasing by electrical injection is $10^6$ Acm$^{-2}$, corresponding to a voltage bias of 10V, assuming a current of 10 mA through the smallest device contact area of 10 μm×10 nm. In order to relax the threshold and current density requirement, the optical mode loss has to be reduced. This may be achieved by increasing the gap size from 5 nm to 20 nm, which would reduce the lasing threshold by a factor of 5. The trade-off between mode confinement and electrical power supply to the laser operation may be taken into account in the design of hybrid photonic-electronic circuits such that the gap size (and shape) is chosen according to the optimal performance.

FIG. 5 shows a schematic diagram of an alternative plasmon laser 40 based on a metal-oxide-semiconductor (MOS) tunnel junction utilizing a Silicon-on-Insulator (SOI) architecture. Plasmon laser 40 features the same optical mode confinement as the nanowire-based nano-laser 10 of FIG. 1, but uses a different the light emission mechanism.

Plasmon laser 40 incorporates a rectangular gain medium 42 that is disposed over a SiO$_2$ substrate 44. Gain medium 42 preferably comprises silicon or other high index material such as a doped semiconductor. A thin oxide (or other low-index material) injection layer 48 separates the gain medium 42 from metal layer 46. To electrically pump the laser 40, an electrical bias V may be applied across the metallic layer 46 and silicon 42 to excite carrier electrons and generate plasmon mode 24.

Figure 6:
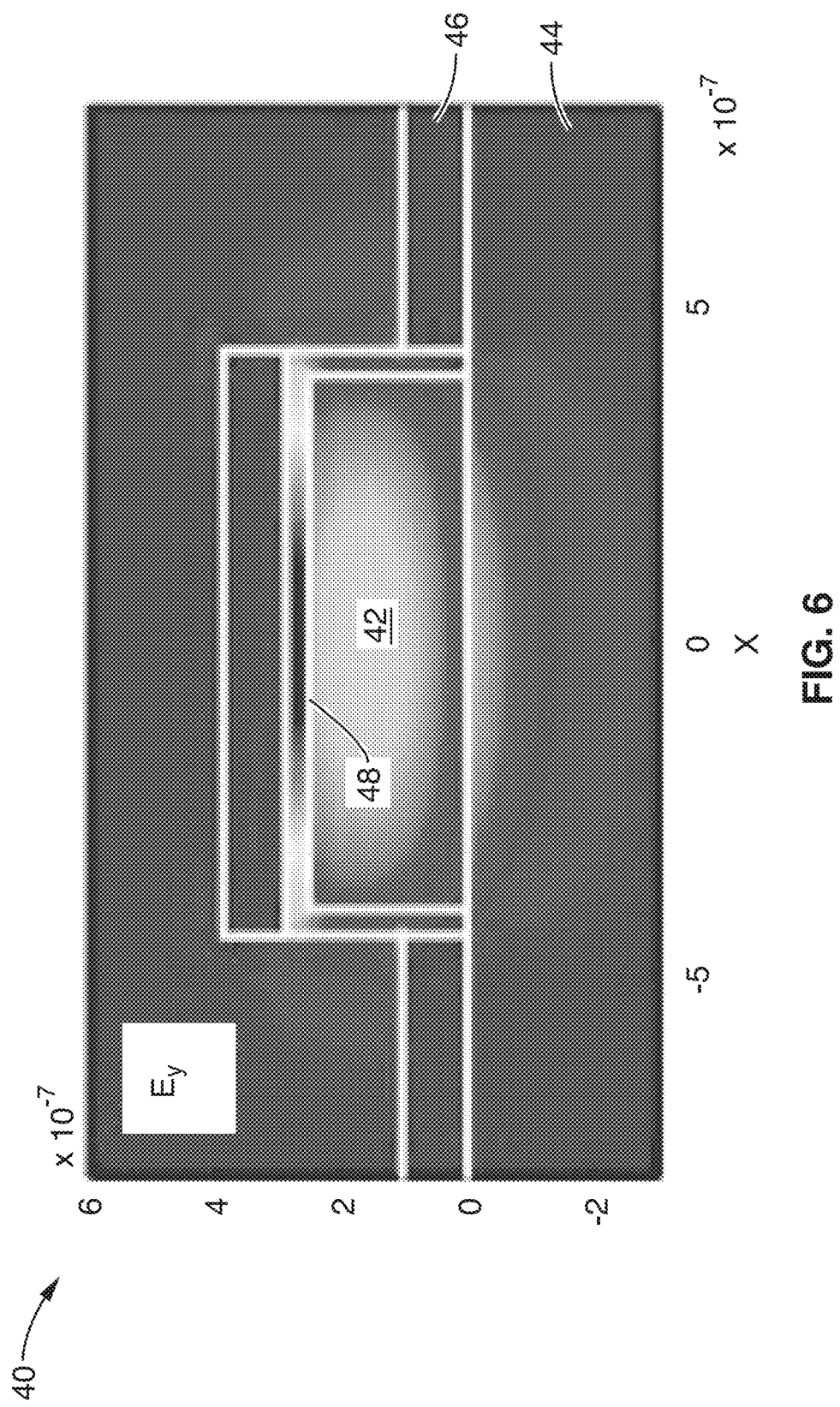
FIG. 6 is a simulated electrical field intensity distribution of a device similar to that shown in FIG. 5.

As shown in the simulated electrical field intensity distribution of FIG. 6, MOS laser device 40 generates extremely strong sub-wavelength optical confinement similar to nanowire laser 10.

Figure 7A:
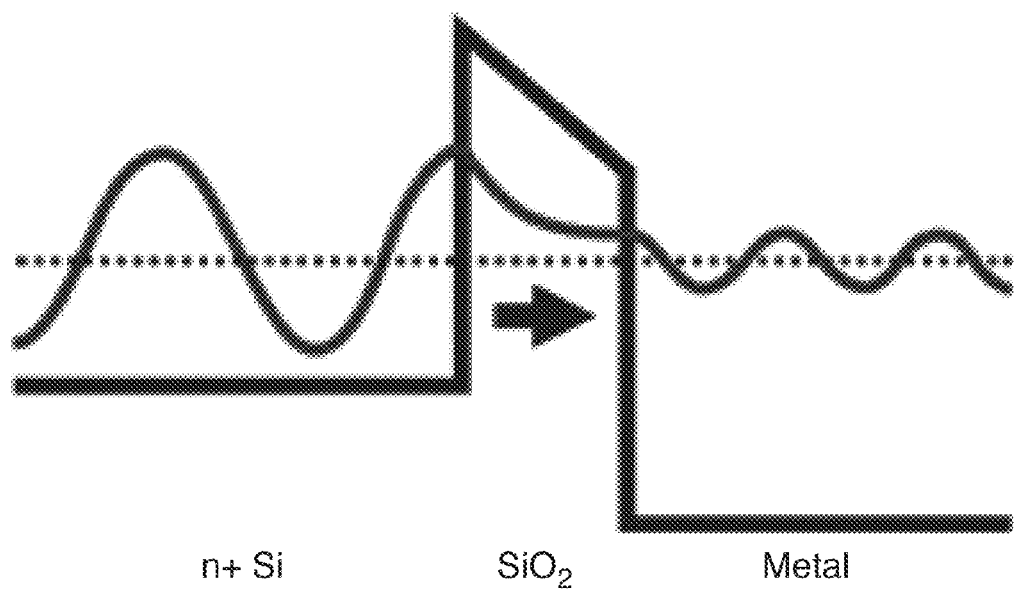
FIGS. 7A and 7B illustrate the underlying optical mechanism of the MOS tunnel junction laser of FIG. 5.
Figure 7B:
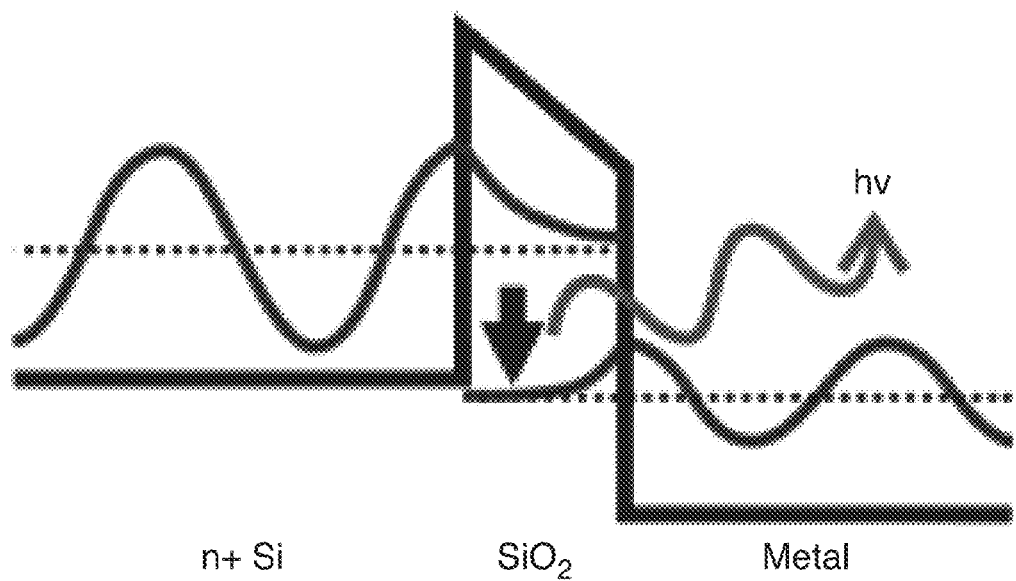

The aforementioned underlying physical mechanism of the MOS tunnel junction laser is depicted in FIG. 7A and FIG. 7B. In the light emission mechanism of MOS laser device 40, tunneling electrons across the insulator barrier 48 scatter inelastically and emit a photon hv (FIG. 3B) when optical amplification (gain) is provided by the electrical power supply V driving the tunneling electrons.

Generally, a laser requires a carrier population inversion. In classical laser, carriers (e-/h+) are excited from the valence band of the semiconductor to the conduction band, from which they can be triggered by photons inside the laser cavity and contribute in a stimulated, coherent fashion to the lasing output. In the MOS tunnel junction laser 40, a perfect carrier inversion is created by biasing an MOS junction. Thus, for a high doping level of the silicon material 42, large numbers of carriers in excess of $10^{21}$/cm$^3$ are available to create this population inversion. Upon applying a bias V across the forward-biased MOS junction, electrons in the upper state can tunnel (carrier population inversion leading to a tunnel current) through the thin oxide 48 and reach the metal 46. This process can occur elastically, as shown in FIG. 7A, or inelastically as shown in FIG. 7B, the energy difference results in a photon emission hv. With the help of a cavity, the photon density can build up increasing stimulated tunnel events, which leads to laser action.

A clear advantage of the plasmonic laser devices 10/40 utilizing metals to support the sub-wavelength plasmonic mode is that those metal films (14, 20, 46) can also be conveniently used to apply an electrical bias as illustrated in FIG. 1 and FIG. 5. Both embodiments facilitate electron tunneling across a nanometers-size thin gap layers 16, 48 to drive the devices 10, 40, respectively.

To show the unique properties of hybridized plasmon modes, the plasmonic lasers of the present invention (cadmium sulphide (CdS) nanowires having diameter d disposed on a silver film, with a magnesium fluoride (MgF$_2$) gap layer as shown in FIG. 3) directly with CdS nanowire lasers on a quartz substrate (photonic laser).

The technical challenge of constructing the plasmonic lasers lies in ensuring good contact between the nanowire and the planar optical film. Low film roughness (~1 nm root mean square, r.m.s.) and accurate deposition allow a <2-nm gap width variation. Crystalline CdS nanowires exhibit extremely low surface roughness, so the contact is limited by film roughness. Nanowires were grown using chemical vapor deposition of CdS powders on Si substrates by self-assembly from a 10-nm Au film seeding layer leading to random nanowire diameters of d=50 nm-500 nm. CdS nanowires were deposited from solution by spin-coating onto pre-prepared films with varying MgF$_2$ thicknesses of 0, 5, 10 and 20 nm, along with control devices of nanowires on a quartz substrate.

A frequency-doubled, mode-locked Ti-sapphire laser (Spectra Physics) was used to pump the plasmonic and photonic lasers ($\lambda_{pump}$=405 nm, repetition rate 80 MHz, pulse length 100 fs). An objective lens (20×, numerical aperture 0.4) was used to focus the pump beam to a 38-μm-diameter spot on the sample. All experiments were carried out at low temperature, T<10 K, using a liquid-He-cooled cryostat (Janis Research). Individual spectra were recorded using a spectrometer with a resolution of 0.25 nm and a liquid-$N_2$-cooled charge-coupled device (CCD) (Princeton Instruments). The lifetime measurements were conducted under very low pump conditions to avoid heating and exciton-exciton scattering effects using time-correlated single photon counting (PicoQuant: PicoHarp 300, Micro Photon Devices APD, 40 ps timing resolution). A 490±10 nm band pass filter was used to filter out ambient light and pass light from the $I_2$ CdS exciton line near 489 nm. An emission model was used to describe the enhanced lifetime data (Purcell effect), which relates to deep subwavelength mode confinement FIG. 8 through FIG. 10 illustrate laser oscillation and threshold characteristics between plasmonic and photonic lasers.

Figure 8:
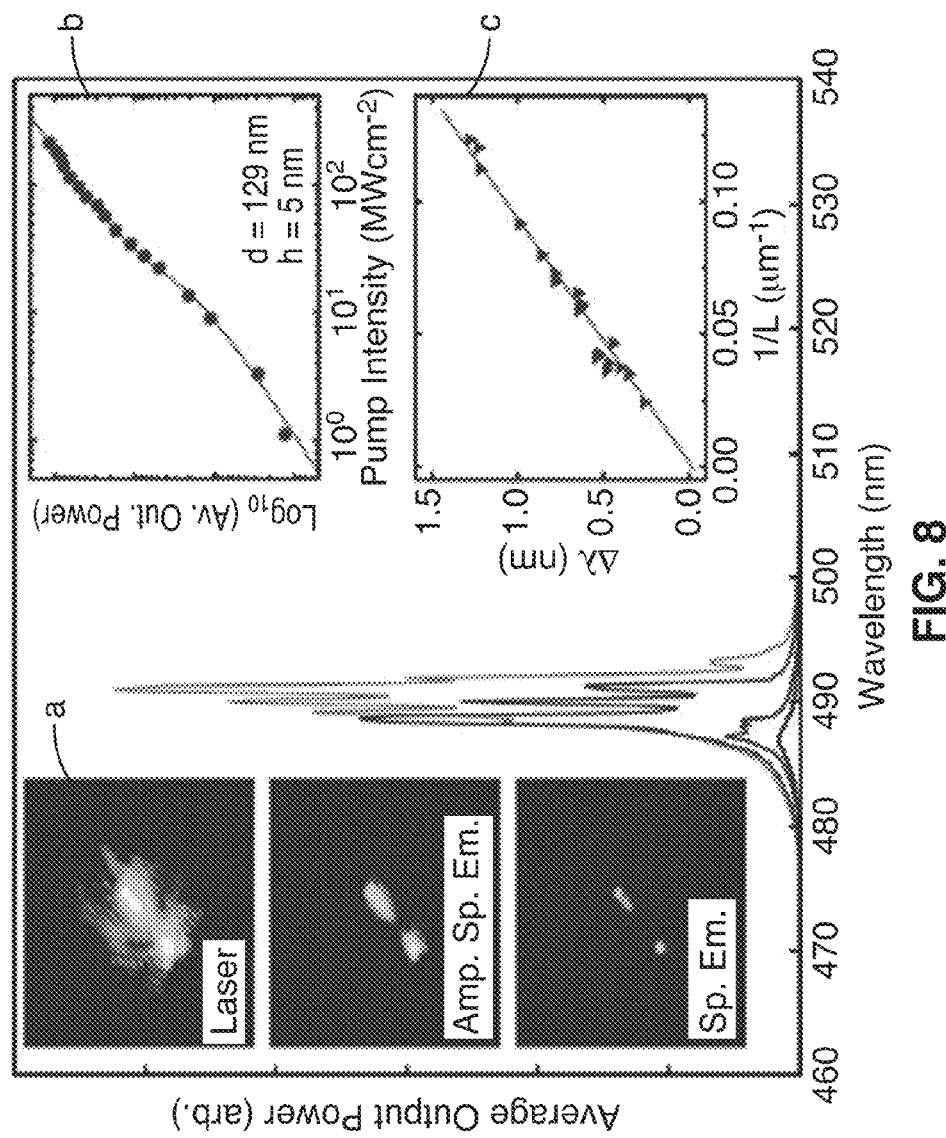
FIG. 8 shows oscillation of a plasmonic laser having dimensions d=129 nm, h=5 nm.

FIG. 8 shows oscillation of a plasmonic laser, d=129 nm, h=5 nm (longitudinal modes). The four spectra for different peak pump intensities exemplify the transition from spontaneous emission (21.25 MWcm$^{-2}$) via amplified spontaneous emission (32.50 MWcm$^{-2}$) to full laser oscillation (76.25 MWcm$^{-2}$ and 131.25 MWcm$^{-2}$). The pictures on the left correspond to microscope images of a plasmon laser with d=66 nm exhibiting spontaneous emission, amplified spontaneous emission and laser oscillation, where the scattered light output is from the end facets. At moderate pump intensities (10-60 MWcm$^{-2}$), the onset of amplified spontaneous emission peaks was observed. These correspond to the longitudinal cavity modes that form when propagation losses are compensated by gain, allowing plasmonic modes to resonate between the reflective nanowire end-facets (note that no reflective surface is needed at the end facets, as the low refractive index of air and high refractive index of the semiconductor material naturally creates a "reflective" interface).

The large amount of gain needed to compensate both cavity and propagation losses produces a strong frequency pulling effect, making the Fabry-Perot modes much more closely spaced than expected for a passive cavity (see inset b in FIG. 8, showing nonlinear response of the output power to the peak pump intensity). The clear signature of multiple cavity mode resonances at higher pump powers demonstrates sufficient material gain to achieve full laser oscillation, shown by the nonlinear response of the integrated output power with increasing input intensity. The occurrence of these cavity resonances indicates that the laser mode's plasmonic coherence is determined by cavity feedback and not by its propagation distance. Inset c of FIG. 8 plots the relationship between mode spacing $\Delta\lambda$ and nanowire length L in c, and shows a high group index of 11 due to the high material gain.

Figure 9:
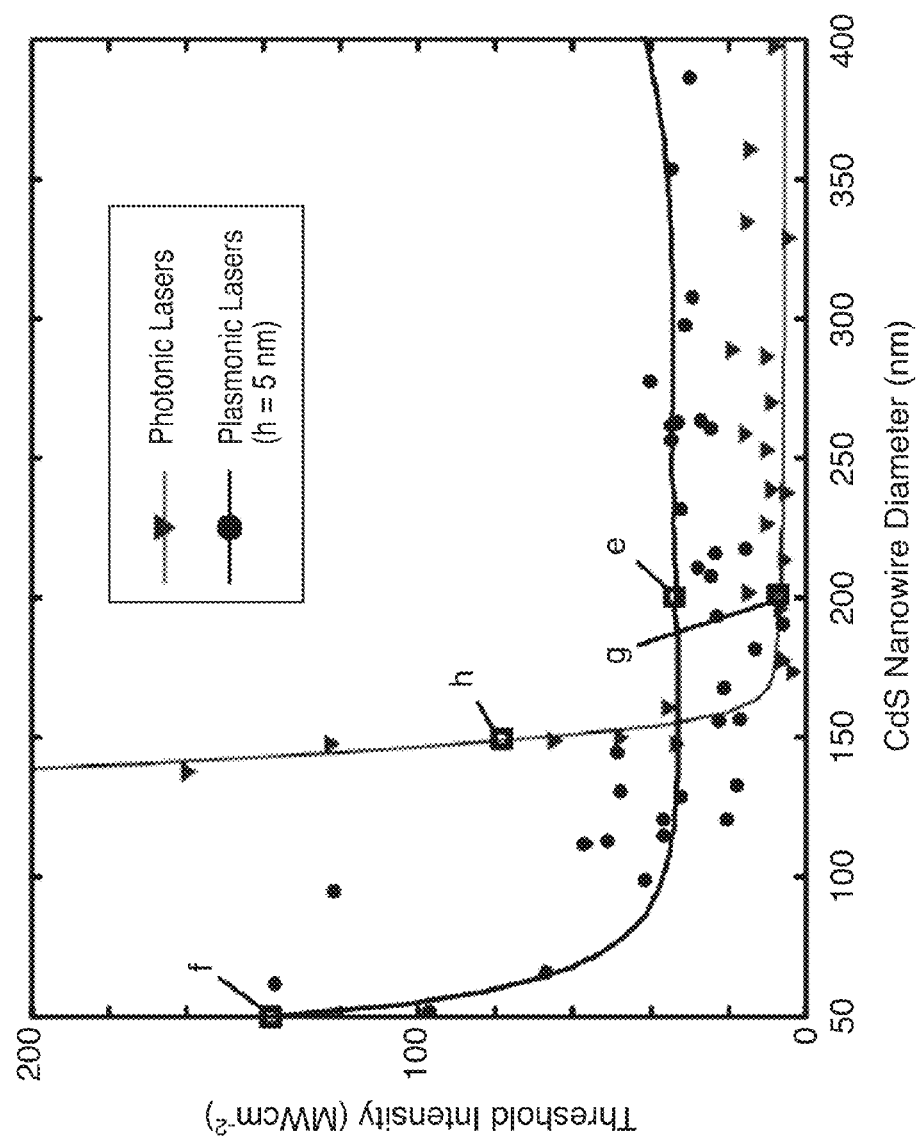
FIG. 9 illustrates the threshold intensity of plasmonic and photonic lasers with varying nanowire diameter.
Figure 10:
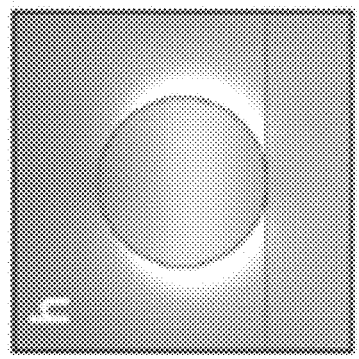
FIG. 10 illustrates electrical field distributions for points e, f, g, and h of FIG. 9 that represent plasmonic lasers having d=200 nm (image e), d=50 nm (image f) and photonic lasers having d=200 nm (image g), d=150 nm (image h).
Figure 10:
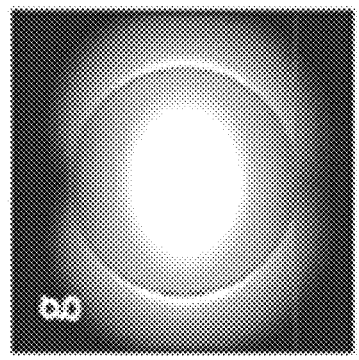
Figure 10:
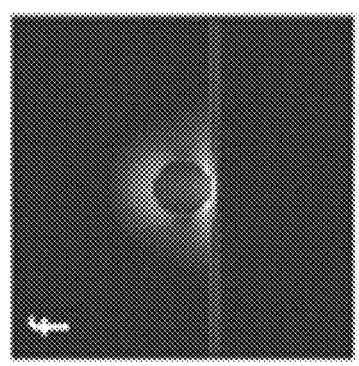
Figure 10:
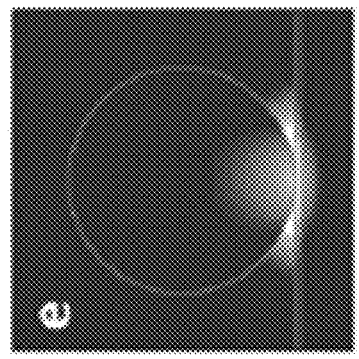

FIG. 9 illustrates the threshold intensity of plasmonic and photonic lasers with varying nanowire (i.e. gain medium) diameter. The experimental data points correspond to the onset of amplified spontaneous emission, which occurs at slightly lower peak pump intensities compared to the threshold of gain saturation. The solid lines show a numerical fit to a simple rate equation model Amplified spontaneous emission in hybrid plasmonic modes occurs at moderate pump intensities of 10-60 MWcm$^{-2}$ across a broad range of diameters.

Surmounting the limitations of conventional optics, not only do hybrid plasmonic lasers support nanometer-scale optical modes, their physical size can also be much smaller than conventional lasers, i.e. the hybrid plasmonic lasers of the present invention operate under conditions where photonic modes cannot even exist. Hybrid plasmonic lasers maintain good mode confinement over a large range of diameters, as shown in FIG. 9 at point e (d=200 nm), and remain confined even for a 50-nm-diameter wire, as shown at point f in FIG. 9. Hybrid plasmonic lasers show only a weak dependence on the nanowire diameter. While hybrid plasmonic modes do not experience mode cutoff, the threshold intensity increases for smaller nanowires owing to the reduction in the total gain volume. FIG. 10 illustrates electrical field distributions for points e, f, g, and h of FIG. 9 represent plasmonic lasers having d=200 nm (image e), d=50 nm (image f) and photonic lasers having d=200 nm (image g), d=150 nm (image h).

Conversely, photonic lasers exhibit a strong dependence of the mode confinement on the nanowire diameter (points g, h). Although the photonic lasers have similar threshold intensities around 10 MWcm$^{-2}$ for all nanowires larger than 200 nm (shown in g), a sharp increase in the threshold occurs for diameters near 150 nm, owing to the loss of confinement within the nanowire and subsequent lack of overlap with the gain region shown in h. (see images g, h in FIG. 10). Below 140 nm, the photonic mode is cut off and lasing could not be observed at all. In contrast, plasmonic lasers maintain strong confinement and optical mode-gain overlap for diameters as small as 52 nm, a diameter for which a photonic mode does not even exist. It should be noted that the values found in FIG. 9 are material specific (e.g. to CdS), and that these number may vary depending on the The relatively small difference in the thresholds of plasmonic and photonic lasers can be attributed to high cavity mirror losses, which are of the same order of magnitude as plasmonic loss.

Plasmonic modes often exhibit highly polarized behavior because the electric field normal to the metal surface binds most strongly to electronic surface charge. The signature of lasing plasmons from the polarization of scattered light from the nanowire end-facets has been detected, which is in the same direction as the nanowire. Conversely, the polarization of scattered light from photonic lasers is perpendicular to the nanowire. This distinction provides a direct confirmation of the plasmonic mode.

Figure 11:
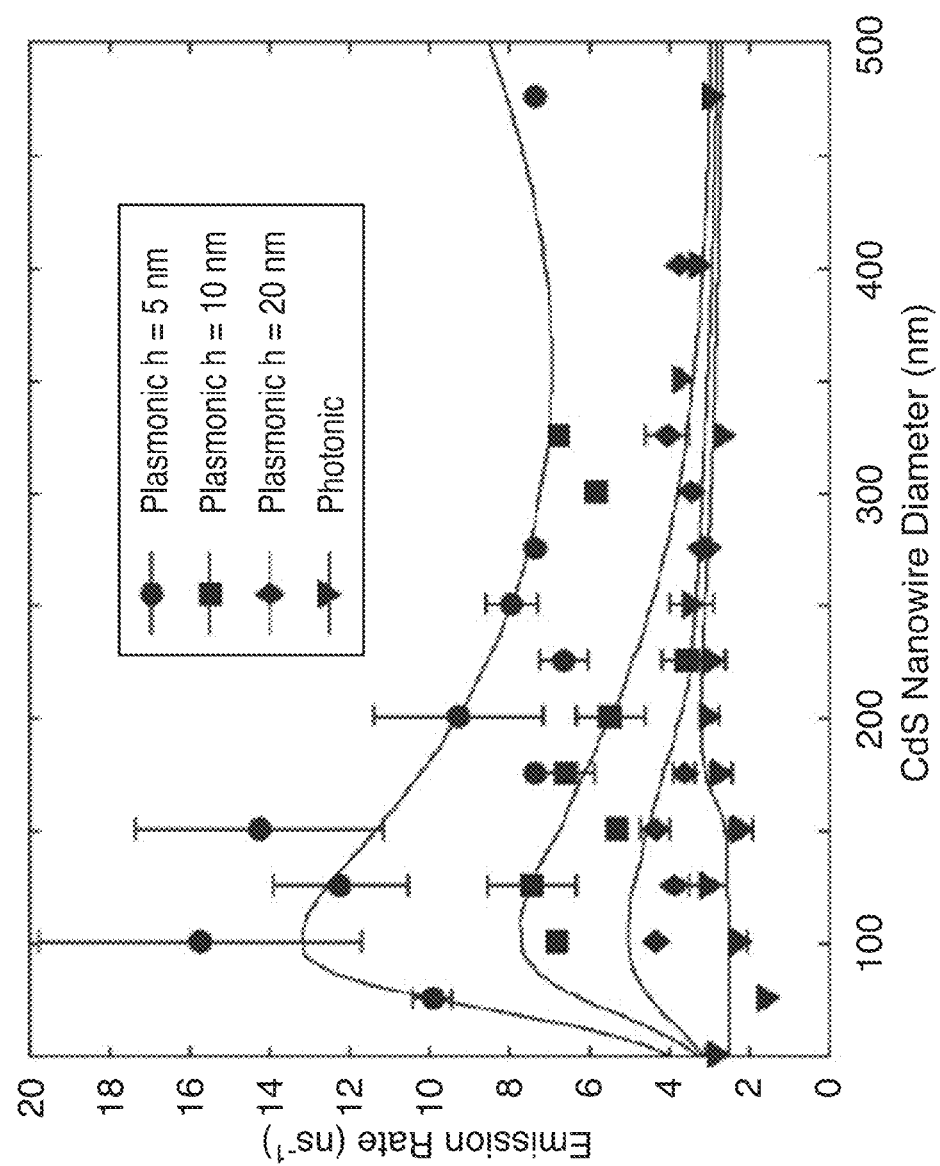
FIG. 11 shows the emission rates of photonic and plasmonic nanowire lasers with different $MgF_2$ gap widths as a function of the nanowire diameter.
Figure 12:
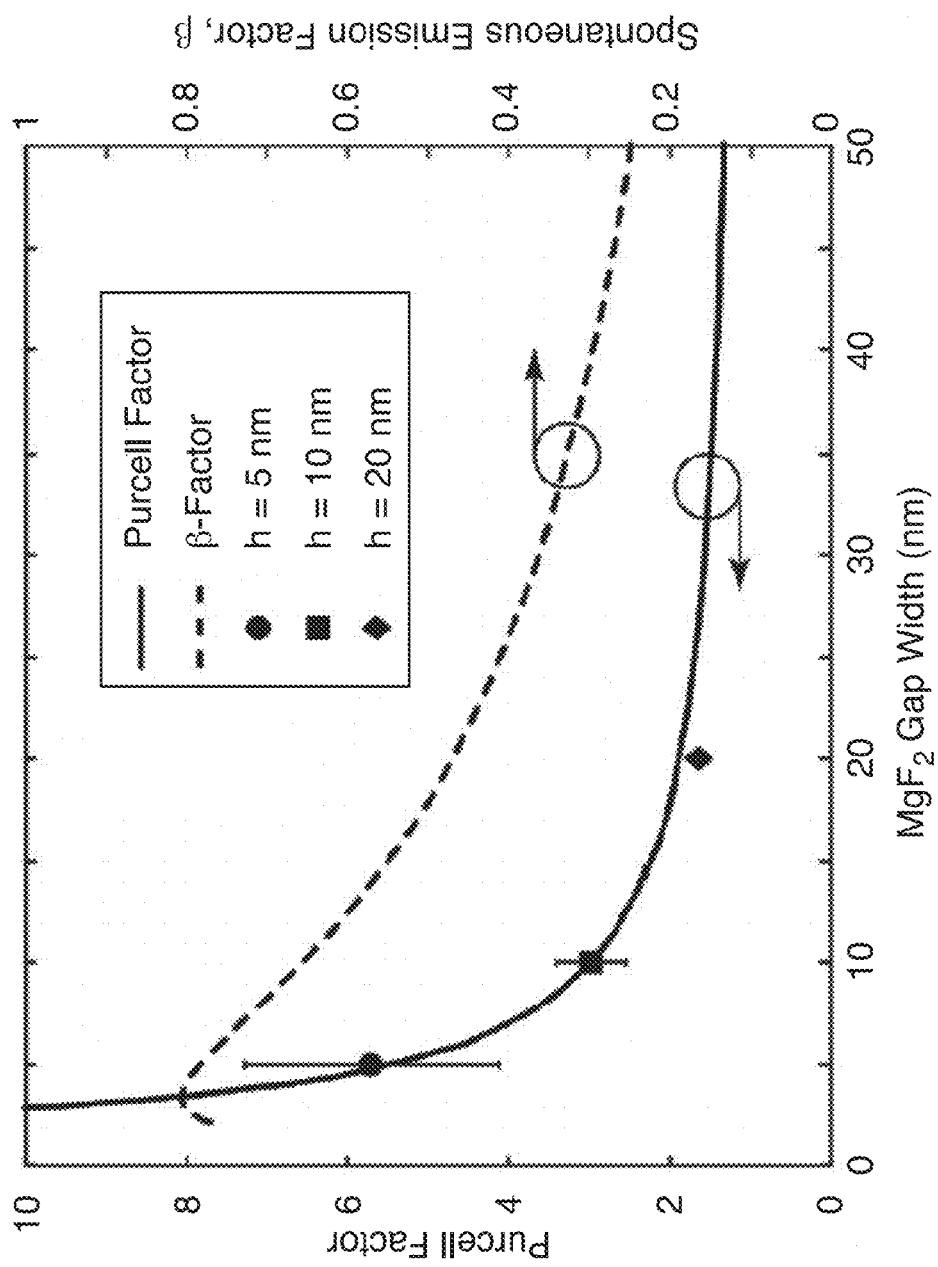
FIG. 12 shows Purcell factors determined from a numerical fit of the emission rate measurements to a simple emission model.

FIG. 11 and FIG. 12 illustrate the Purcell effect in plasmonic and photonic lasers. FIG. 11 shows the emission rates of photonic and plasmonic nanowire lasers with different MgF$_2$ gap widths as a function of the nanowire diameter following the calculated trend. The optimal confinement condition of hybrid plasmonic modes is found near d=120 nm, where the hybridization of nanowire and surface plasmon polariton modes is strongest, giving the highest emission rate. The error bars show standard deviation of emission rates from data collected within 25 nm nanowire diameter ranges.

FIG. 12 shows Purcell factors determined from a numerical fit of the emission rate measurements to a simple emission model. Near optimal confinement (d=120 nm±20 nm), the average Purcell factor for devices with 5-nm gaps is more than six, which is considered high for a broad-band effect. The error bars show standard deviation of Purcell Factors for nanowire diameters, d=[100, 140] nm.

As shown in FIG. 11, a strong increase of the spontaneous emission rate was found when the gap size between the nanowire and metal surface is decreased. Lifetime measurements reveal a Purcell factor of more than six for a gap width of 5 nm and nanowire diameters near 120 nm, where hybrid plasmonic modes are most strongly localized. This enhancement factor corresponds to a mode that is a hundred times smaller than the diffraction limit, which agrees well with our mode size calculations. While the enhanced emission rate, or Purcell effect, is usually associated with micro-cavities, a broad-band Purcell effect arising from mode confinement was observed alone without a cavity.

The physics underlying the gain mechanism in the plasmonic lasers was examined, which combines exciton dynamics, the modification of spontaneous emission and mode competition. Although photo-generated excitons have intrinsic lifetimes of up to 400 ps, they recombine faster at the edge of the nanowire near the gap region owing to strong optical confinement mediated by the hybrid plasmon mode. The exciton diffusion length in bulk CdS is about a micrometer, which is much larger than the nanowire diameter. Therefore, the distribution of exciton recombination quickly adjusts itself to match the hybrid mode's profile (see FIG. 3).

The fast diffusion and enhanced emission rate into the hybrid plasmonic mode lead to preferential plasmon generation. In this way, the proportion of light that couples into the laser mode, or spontaneous emission factor β—can be high. The β-factor was also calculated from the emission model fit by accounting for the possible emission pathways. The β-factor reaches a maximum of 80% for a gap width near 5 nm (see FIG. 12). At gap widths smaller than 5 nm, the exciton recombination is too close to the metal surface. This non-radiative quenching causes a sharp drop in the hybrid plasmon β-factor. Although nanowires placed in direct contact with the metal surface show the highest spontaneous emission rates, these devices exhibit weak luminescence and do not lase. The calculations support these observations, indicating that there is a sharp reduction in the b-factor below gap widths of 5 nm. The laser threshold is commonly manifested as a 'kink' between two linear regimes of the output power versus pump intensity response (log-log scale). However, it is known that lasers with strong mode confinement do not necessarily exhibit such behavior, so that the laser threshold may be obscured.

Figure 13:
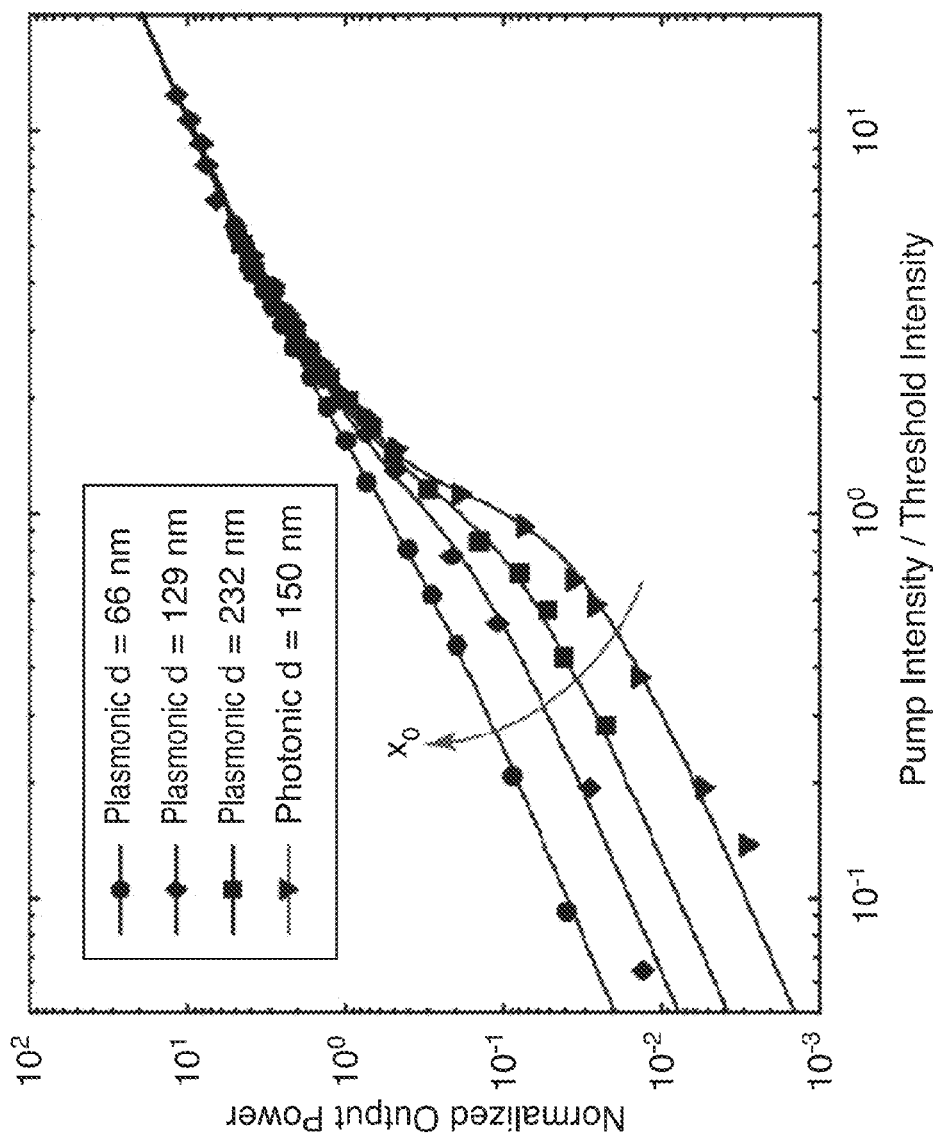
FIG. 13 illustrates the signature of threshold-less lasing due to high β-factor.

FIG. 13 illustrates the signature of threshold-less lasing due to high β-factor. The plasmonic lasers of the present invention exhibit strong mode confinement, so we do indeed observe this 'smearing' of the threshold pump intensity. The measured photonic lasers, on the other hand, show the distinctive kink in the output power, which is in agreement with recently reported zinc oxide nanowire lasers. Both plasmonic and photonic lasers in the present experiments use the same gain material, so the smeared response in output power is believed to arise from local electromagnetic field confinement. This distinct behavior is therefore attributed to the increased b-factor of the hybrid plasmon mode. A high β-factor is often associated with low threshold laser operation where undesired emission modes are suppressed. Although the nearly linear response, shown in FIG. 13 for a nanowire diameter of 66 nm, may therefore give the impression of a lower threshold, in reality, the laser threshold occurs only once cavity losses are compensated.

This demonstration of deep subwavelength plasmonic laser action at visible frequencies suggests that the laser sources of the present invention produce coherent light far below the diffraction limit. Extremely strong mode confinement, which is evident from the up to twenty fold increase of the spontaneous emission rate, and the resulting high β-factor, are key aspects of the operation of deep subwavelength lasers.

Figure 14:
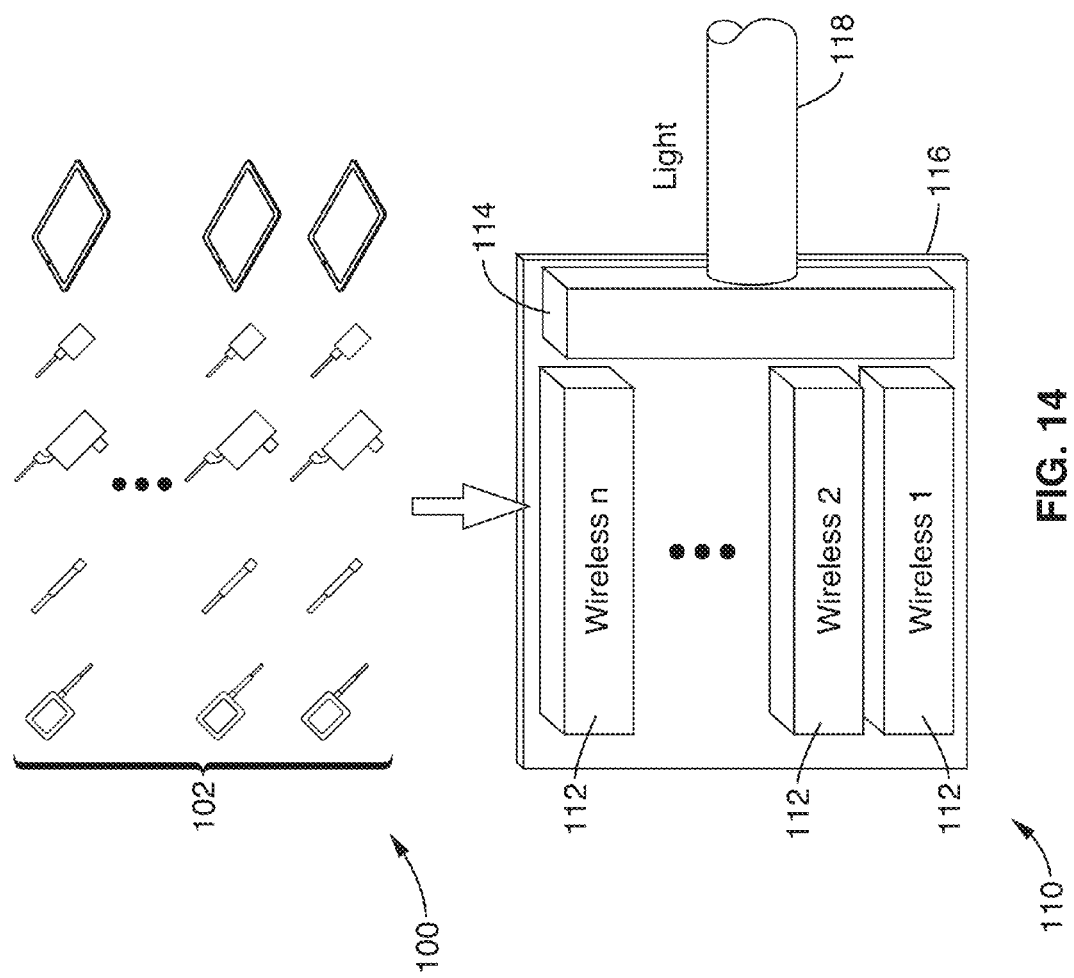
FIG. 14 illustrates a schematic diagram of a Wavelength Division Multiplexing (WDM) architecture for an optical network or backbone.

FIG. 14 illustrates a schematic diagram of a Wavelength Division Multiplexing (WDM) architecture for optical network or backbone 100. Currently it comprises of many individual optical components 102 one a WDM grid 110 operating over a plurality of channels or wavelengths 112, which are then multiplexed at 114 to be transmitted over line 118.

The plasmon nanolasers of the present invention may be used as an integral part of photonic integrated circuits (PIC's) that are able to provide ultra high bandwidths at low cost factors due to the power of integration via scaling. Paramount is achieving a precise control over the emission parameters so as to address the requirements of WDM network architecture 100 (FIG. 14) on an ultra-small scale. These include the emission wavelength, which should be carefully matched to the WDM grid, fine tuning over the laser spectral width to achieve a desired balance between the spectral spacing of the WDM grid and the information bandwidth of each channel. In order to realize telecoms compatible systems, one can use III-V materials such as InGaAsP in plasmonic lasers for operation in the telecom band between 1.3-1.6 μm.

In particular, the plasmon devices of the present invention may provide laser device packing without cross talk, fast parallel electrical pumping schemes and power consumption in massively parallel lasers. Such a system could later be scaled up to 40 channels to cover an entire WDM band, with industrial fabrication precision. Due to the ultra-small footprint of a single device, a plasmon laser array of 40 WDM channels will only occupy a 5 μm×5 μm area of the PIC and the electrical operation will enable individual modulation of each device within that small footprint.

Figure 15:
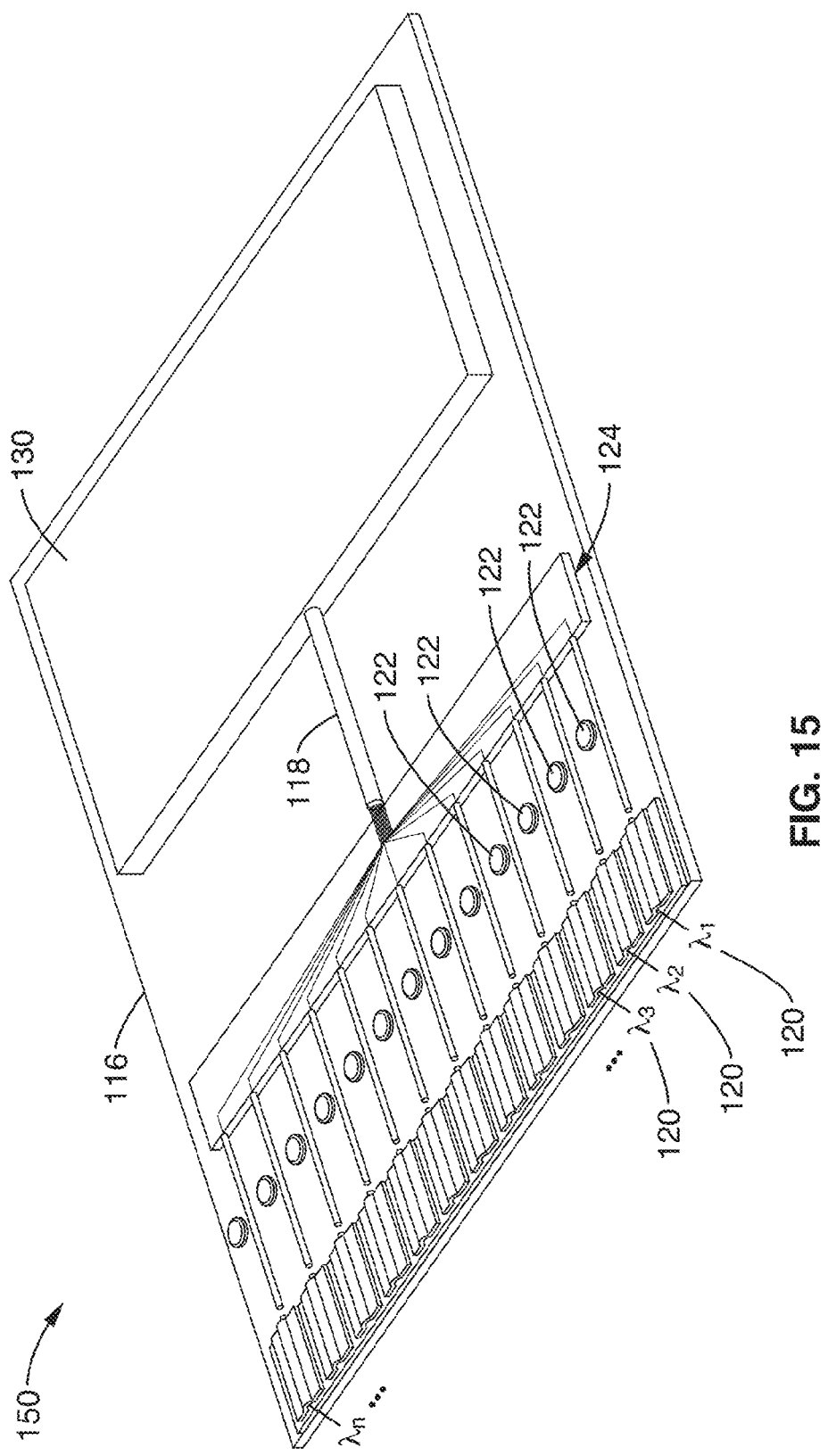
FIG. 15 shows a PIC for WDM including a board housing a plurality of plasmon lasers.

Referring now to FIG. 15 a plurality of electrically driven plasmon lasers 120 (e.g. laser 10 shown in FIG. 1) may be used to drive optical inter and intra chip interconnect solutions for a PIC 150, e.g. data routing between multiple computing cores.

PIC 150 for WDM may comprise a board housing a plurality of plasmon lasers 120 each communicating data over a plurality of channels $\lambda_1$-$\lambda_n$. The output of the lasers 120 is coupled to an individual add-drop filter 122 and then multiplexed at multiplexer 124 to be transmitted across line 118 to electrical chip 130.

While many PIC components have been demonstrated, the on-chip laser light source is still facing many challenges. The plasmon lasers of the present invention provide a crucial component in large-scale photonic integration. The advantages of the plasmonic laser source of the present invention over conventional laser sources are small footprint approaching state-of-the-art transistor lengths and high modulation speeds. Both of these key-features are critical for successful high performance and low cost integration.

The Plasmon nanolaser (e.g. laser 10 shown in FIG. 1) may also be integrated as a device for single molecular optical sensing and manipulation. Optical metrology, and in particular, sensing applications, are becoming extremely important in the bio-medical arena. Interfacing and sensing biological as well as chemical substances for health treatments and/or chemical trace detections (bio-hazardous warfare) can be done with high sensitivity and selectivity via optical detection and analysis.

The plasmon laser light source 10 of FIG. 1 may be integrated with micro-fluidic channels (not shown) such that the nanoscale emission mode 24 of is used to sense biological matter with scales that approach the size of an individual protein molecule (e.g. ~5 nm), or other lab-on-chip applications.

The unique optical sub-wavelength mode feature of the plasmon laser 10 approaches single molecular scales, which enables such a bio-sensor to become extremely sensitive. As an alternative, the unique physical properties of the Graphene hole-injection and bottom (electron-injection) contact of laser 80 of FIG. 4B would allow for construct air-gaps, leaving this region accessible for various sensing and bio-molecule detection applications.

Furthermore, the small optical mode 24 of the plasmon laser 10 may be utilized as a manipulating and cutting tool, particularly for cutting/ablation of biological tissues, e.g. affected cancer cells, with unprecedented surgical precision for health care treatments.

Referring now to FIG. 16 and FIG. 17A through FIG. 17D, a plasmon nanolaser with room-temperature operation was demonstrated. The high power, coherent and deep sub-wavelength optical field inside the plasmon lasers of the present invention have the unique ability to drastically enhance light-matter interactions bringing fundamentally new capabilities to biosensing, data storage, photolithography and optical communications. The nano-scale physical size of plasmon lasers is another major advantage that can reconcile the device footprints of optical and electronic systems. However, these important applications require room temperature operation of sub-diffraction limited lasers with effective cavity feedback, low metal loss and high gain.

Figure 16:
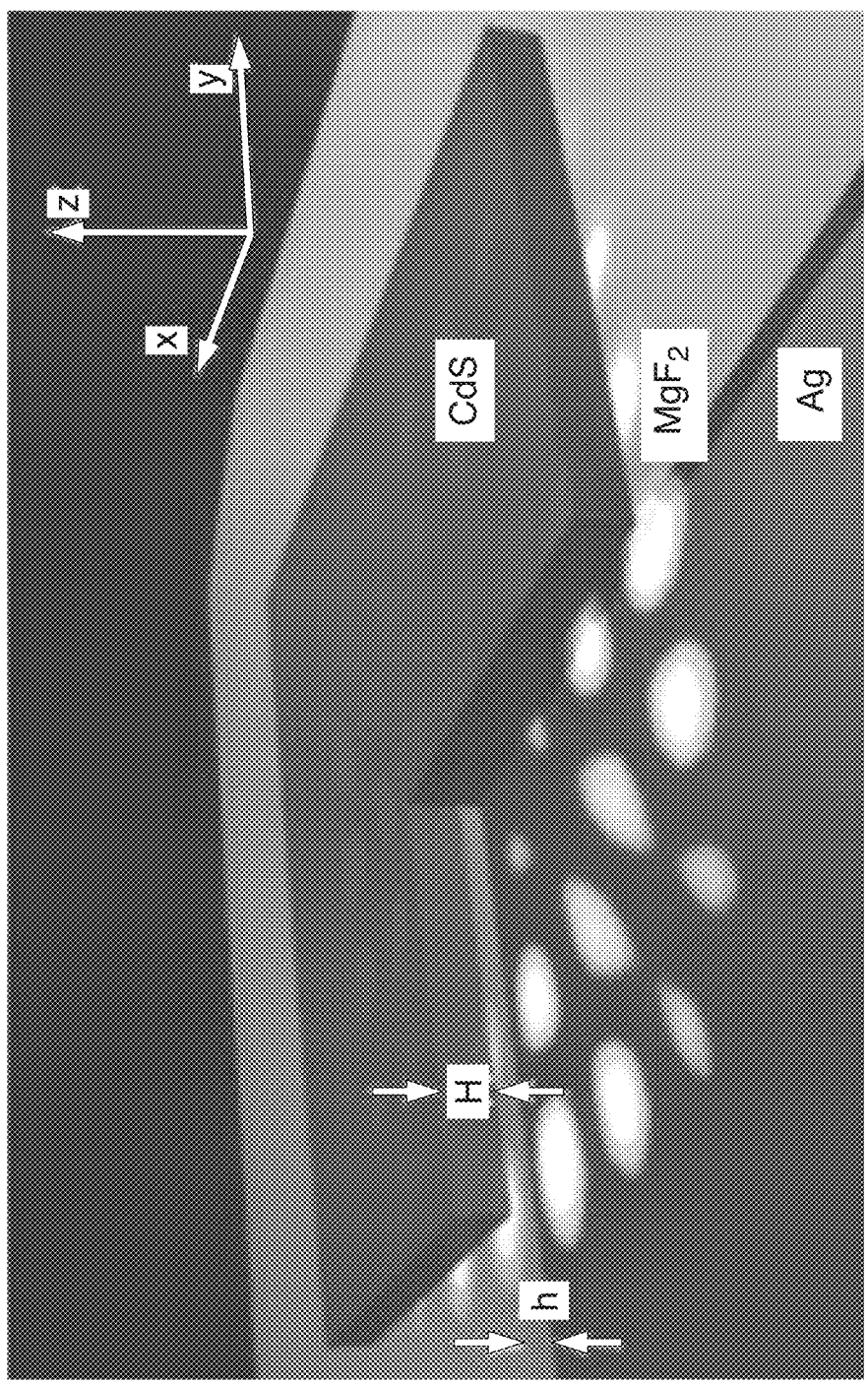
FIG. 16 illustrates a simulated depiction of a room temperature plasmon laser.

FIG. 16 illustrates a simulated depiction of a room temperature plasmon laser with a sub-wavelength mode size of $\lambda/20$. In the device of FIG. 16, total internal reflection of surface plasmons is used to mitigate the radiation loss, while hybrid semiconductor-insulator-metal nano-squares are for strong confinement with low metal loss. Essentially, both loss channels are overcome simultaneously, which enables sub-diffraction limited laser operation at room temperature, and with a much shorter cavity length than with reported cryogenic-based sources. Furthermore, by controlling the structural geometry, the number of cavity modes is reduced, with the capability to achieve even a single mode laser.

The device of FIG. 16 comprises of a 45 nm thick (H), 1 μm length single crystal Cadmium Sulfide (CdS) square (forming the gain medium) atop a silver (Ag) surface, and separated by a 5 nm thick (h) Magnesium Fluoride ($MgF_2$) gap layer. Remarkably, the thickness of this device is comparable to the gate size of transistors in commercial chip-architecture; a truly nanoscopic device. Efficient feedback arises from total internal reflection of confined surface plasmons at the cavity boundaries and suffers very low scattering loss despite the open configuration. The close proximity of the high permittivity CdS square and silver surface strongly confines transverse magnetic (TM) waves to the gap region, while transverse electric (TE) waves are pushed away from the metal. While both mode polarizations are free to propagate in the plane, only TM modes undergo total internal reflection at the device boundaries providing the feedback for lasing.

Thus, while the devices of FIG. 1 through FIG. 5 are directed to a 1-D mode, e.g. emission 24 being constrained in two dimensions while free to emit in the longitudinal (nanowire axis 12) direction, the device of FIG. 16 is only constrained in one dimension, and is free to propagate in-plane. It is appreciated that the planar gain medium (depicted as the CdS square pad in FIG. 16) may comprise any planar shape (e.g. circular, triangular, freeform, etc) where the planar dimensions (plane area) are significantly larger than the structure's thickness H (out of plane). The dimensions of the planar gain medium may also vary. For example, the thickness H may vary from less than 20 nm to 200 nm or more. The planar dimensions may range from less than 100 nm to over 1 μm in length/width.

In addition to the 2-D constrained mode of the device of FIG. 16, it is also appreciated that the plasmon laser source of the present invention may be constrained in 3 dimensions (e.g. 0-D emission). The high momentum supported by plasmon mode makes it possible to keep scaling down the plasmon laser using total internal reflection mode. Such device may comprise a spherical metallic (e.g. of nanoscale size), disposed over or wrapped in a gain medium comprising a semiconductor, quantum dots, light emitting molecules, etc. A thin, low-index dielectric layer (e.g. oxide) may also be disposed between the gain material and metal sphere. The optical laser mode (set by the resonance of the metal particle=laser cavity) is a "localized" for the 0-D plasmon laser, and is not propagating (like in the 1D or 2D case).

The semiconductor pad of the device in FIG. 16 may also be scaled down to create a "pseudo 0-D device," wherein the optical laser mode is effectively confined in 3 dimensions for 3 dimensional deep subwavelength optical confinement ($<<\lambda$). In this embodiment, the small planar dimensions of the semiconductor pad (e.g. having length or width between 20 nm and 100 nm and thickness of ~40 nm), would effectively constrain the optical emission in all three dimensions.

Figure 17A:
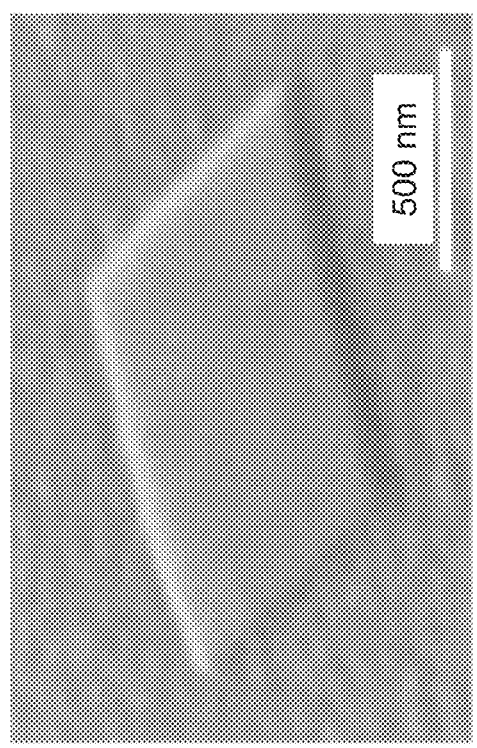
FIG. 17A is an SEM image of the device of FIG. 16.

The plasmon light source of FIG. 16 was fabricated (an SEM image of which is shown in FIG. 17A) and tested. The strong feedback results in cavity modes in the spontaneous emission spectrum below threshold, as shown in FIG. 17B, which illustrates the emission spectra for varying pump intensity showing the transition from spontaneous emission (1760 MW cm$^{-2}$) via amplified spontaneous emission (2300 MW cm$^{-2}$) to full laser oscillation (3070 MW cm$^{-2}$; and 4020 MW cm$^{-2}$) and the spectral narrowing of the laser modes.

Figure 17B:
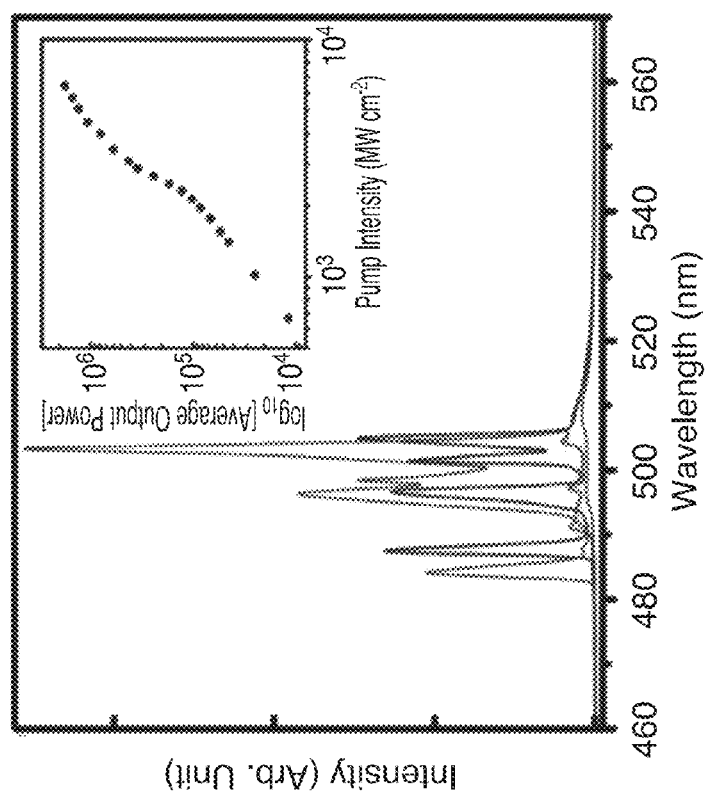
FIG. 17B illustrates the emission spectra for varying pump intensity showing the transition from spontaneous emission (1760 MW cm$^{-2}$) via amplified spontaneous emission (2300 MW cm$^{-2}$) to full laser oscillation (3070 MW cm$^{-2}$; and 4020 MW cm$^{-2}$) and the spectral narrowing of the laser modes.

At higher pump powers, we observe multiple cavity modes with considerably higher coherence than the underlying spontaneous emission, as shown in FIG. 17B. The variation of integrated output power with increasing pump intensity (inset of FIG. 17B) confirms the observation of full laser oscillation. Lasing in such ultrathin devices is viable solely due the plasmonic confinement and total internal reflection feedback and was not observed in control samples consisting of CdS squares on quartz substrates where the poor mode confinement and scattering inhibit any laser action.

Figure 17D:
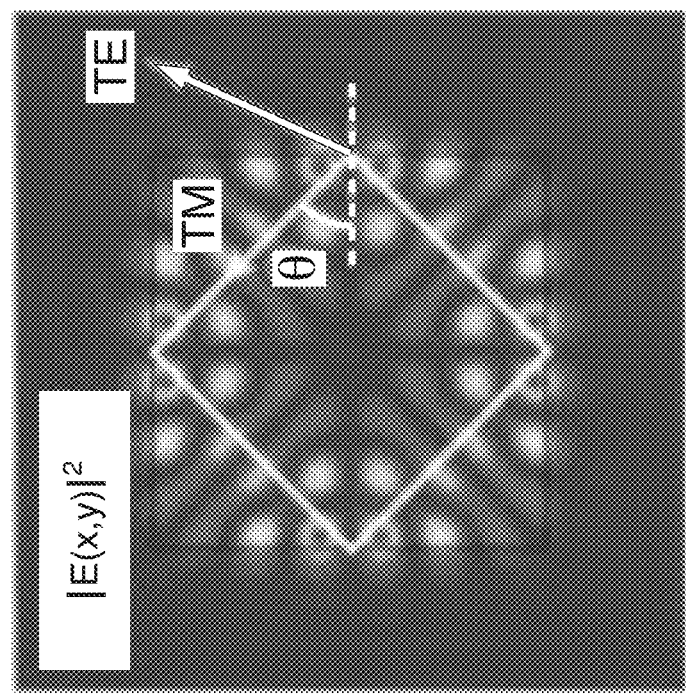
FIG. 17D illustrates the simulated electromagnetic energy distribution of a TM mode for the device of FIG. 16 in the x and y directions. TE modes experience no feedback.
Figure 17C:
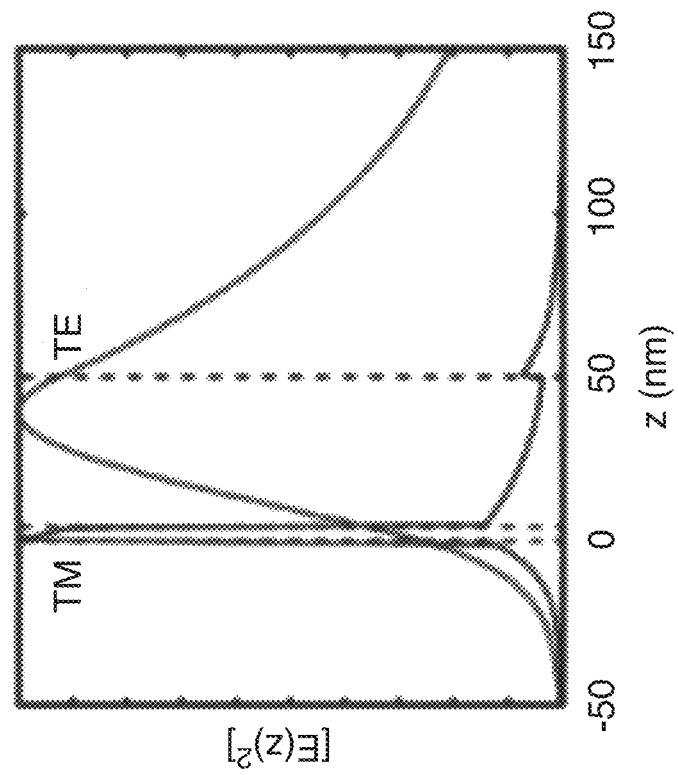
FIG. 17C illustrates the electric field distribution of transverse magnetic (TM) and transverse electric (TE) modes along with laser's z direction.

FIG. 17C illustrates the electric field distribution of transverse magnetic (TM) and transverse electric (TE) modes along with laser's z direction.

FIG. 17D illustrates the simulated electromagnetic energy distribution of a TM mode for the device of FIG. 16 in the x and y directions. TE modes experience no feedback.

A key feature of ultra small (sub-wavelength) electrically driven laser devices is their unique ability for fast modulation. However, recent reports have raised some uncertainty that the predicted switching speeds (~1 THz) are possible due to the role of gain compression, which is a more practical limitation in all semiconductor lasers (see E. K. Lau et al Optics Express 17, 7790 (2009)). Gain compression arises from non-linearity in the gain as a function of both electronic inversion and laser mode intensity.

Figure 18:
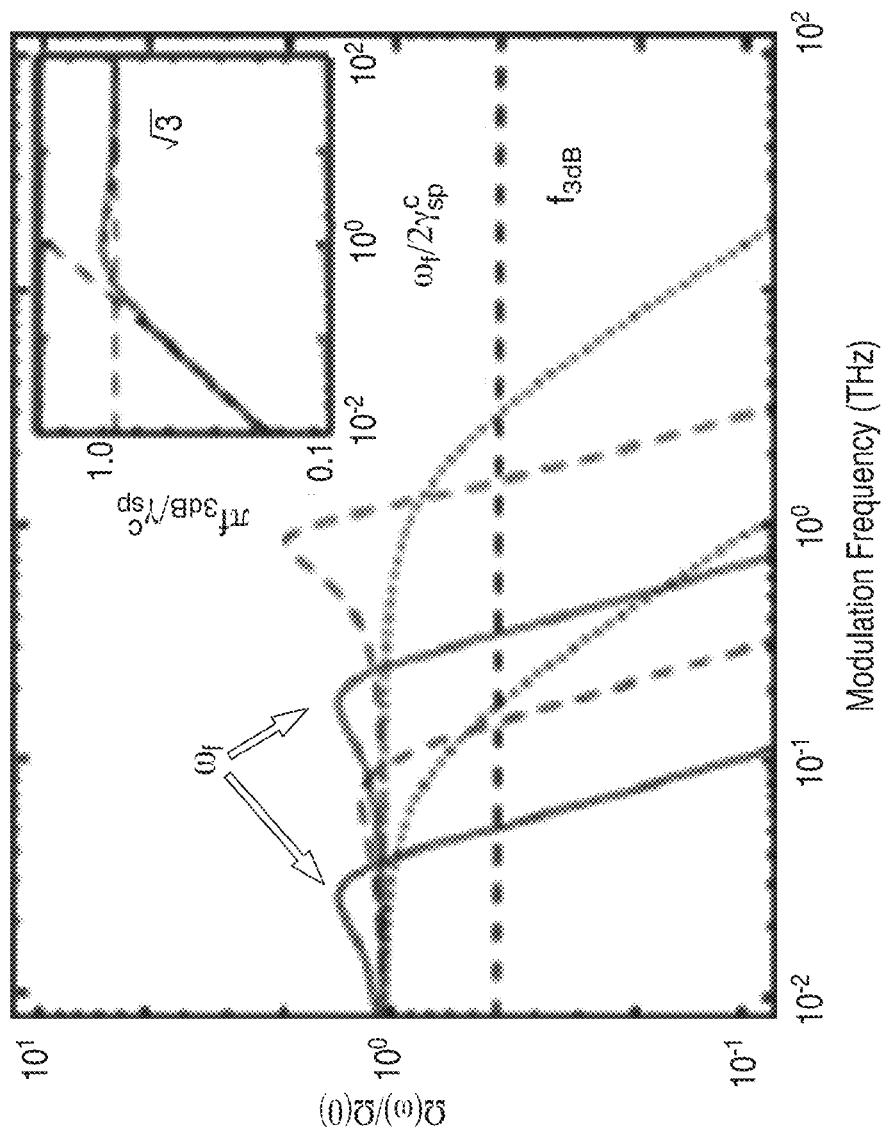
FIG. 18 shows the temporal response of various surface plasmon lasers in accordance with the present invention.

FIG. 18 shows the temporal response of various surface plasmon lasers in accordance with the present invention, and in particular the response function for light emission into nanowire (e.g. laser 10 of FIG. 1) and planar (e.g. FIG. 16) plasmonic laser cavities with a gain medium emitting at a telecoms frequency (200 THz) and at three different pump current densities are studied: $J/J_{th}=10$ (solid lines), $J/J_{th}=200$ (dashed lines) and $J/J_{th}\to\infty$.

Results show the hybrid plasmonic laser's potential to delay the effects of gain compression and access much faster modulation. It is believed that the Purcell effect leads to an enhancement of the stimulated emission rate as well as that of spontaneous emission. This effectively delays the onset of gain compression by the Purcell factor. In the (optically pumped) plasmonic nanowire based systems of the present invention, this amounts to increasing the modulation speed by at least a factor of ten, as shown in FIG. 12. This corresponds to modulation rates well beyond those of diffraction limited devices (conventional lasers at 40 GHz), in excess of 1 THz. Calculation results are shown in FIG. 18, which show direct modulation speeds well into the THz range.

In addition to fast modulation and nanoscale mode confinement, the hybrid plasmon light sources of the present invention are also highly efficient, e.g. they provide a low-loss source without sacrificing mode confinement. Generally the loss of the plasmon mode is size and wavelength dependent, and varies in the range of 0.01-100 1/cm. For loss/wavelength units, a loss between 0.0001-0.1 (unit-less) or in scientific notation: $10^{-4}$-$10^{-1}$ was found.

An electrically-driven light source is often the most efficient, feasible and cost effective way for many applications involving integration of photonic and electronic elements. This becomes most significant when the laser's physical size is below the diffraction limit of the light hence cannot be individually pumped by a light source. The plasmon lasers disclosed above offer an efficient and easy-to-deploy means of operation, while allowing dense integration over a large scale on e.g. semiconductor wafer platforms.

From the discussion above it will be appreciated that the invention can be embodied in various ways, including the following:

1. A plasmon laser source, comprising: a metal substrate; a semiconductor material; the semiconductor material being separated from a surface of the metal substrate by a low-refraction index gap; and an electron pumping means; wherein the electron pumping means is configured to excite an electron carrier population to generate a plasmonic laser emission from the low-refraction index gap; wherein the plasmonic laser emission is confined by a plasmonic mode having a mode size smaller than the diffraction limit of light in at least one dimension.

2. The laser source of embodiment 1, wherein at least a portion of the electron carrier population travel from the metal substrate through the low-refraction index gap to the semiconductor material.

3. The laser source of embodiment 1, wherein the laser source supports a plasmonic mode having a mode size smaller than $\lambda/2$ in at least one dimension of the mode.

4. The laser source of embodiment 3, wherein the laser source supports a plasmonic mode having a mode size smaller than $\lambda/20$ in at least one dimension of the mode.

5. The laser source of embodiment 1, wherein the low-refraction index gap comprises a layer of material having a thickness that ranges between approximately 1 nm and approximately 100 nm.

6. The laser source of embodiment 5, wherein the low-refraction index gap comprises a layer of material having a thickness that ranges between approximately 2 nm and approximately 50 nm.

7. The laser source of embodiment 6, wherein the low-refraction index gap comprises a layer of material having a thickness that ranges between approximately 5 nm and approximately 10 nm.

8. The laser source of embodiment 6, the laser source generates a plasmonic mode emission having a mode size confined to be smaller than 10 nm in at least one dimension.

9. The laser source of embodiment 1, wherein the low-refraction index gap has an index of refraction between 1 and 2.

10. The laser source of embodiment 9, wherein the semiconductor material has an index of refraction between 2.5 and 3.5.

11. The laser source of embodiment 1, wherein the semiconductor material comprises a gain medium for amplifying light.

12. The laser source of embodiment 1, further comprising: a positive charge carrier layer disposed over at least a portion of the semiconductor material opposite from said low-refraction index gap; wherein the positive charge carrier is configured to allow hole electrons to travel through the positive charge carrier layer to the semiconductor material.

13. The laser source of embodiment 1, further comprising: an electrode coupled to said hole injection layer; wherein the electron pumping means comprises an electronic voltage source configured to apply an electrical bias across the electrode and the metal substrate.

14. The laser source of embodiment 1, wherein the semiconductor material comprises a nanowire having a first dimension less than 150 nm.

15. The laser source of embodiment 1: wherein the semiconductor comprises a doped semiconductor, wherein the electron pumping means comprises an electronic voltage source configured to apply an electrical bias across the doped semiconductor and the metal substrate; the laser source comprising an MOS junction; wherein the electrical bias is configured to generate an electron carrier inversion by biasing the MOS junction.

16. The laser source of embodiment 1, wherein said laser source operates at room temperature.

17. The laser source of embodiment 1, wherein said semiconductor gain material is configured to be selected from a plurality of different semiconductor materials to determine the wavelength of the plasmonic laser emission.

18. The laser source of embodiment 1, wherein the said semiconductor gain material is comprises a planar structure configured to confine plasmonic laser emission in only one dimension.

19. The laser source of embodiment 18, wherein said planar structure is sized to confine plasmonic laser emission in three dimensions.

20. The laser source of embodiment 1, wherein said laser source has a loss, in loss/wavelength units, of between 0.0001-0.1.

21. The laser source of embodiment 1, wherein the laser source is configured to support modulation speeds faster than 40 GHz.

22. The laser source of embodiment 1, wherein the laser source is configured to support modulation speeds faster than 1 THz.

23. A method for generating a plasmonic laser emission, the plasmonic laser emission having a mode size smaller than the diffraction limit of light, the method comprising the steps of: generating an electrical bias across a metal substrate and a semiconductor material; the semiconductor material being separated from a surface of the metal substrate by a low-refraction index gap; and exciting an electron carrier population within the semiconductor material; and generating the plasmonic emission from the low-refraction index gap.

24. The method of embodiment 23, wherein the plasmonic mode has a mode size smaller than $\lambda/2$ in at least one dimension of the mode.

25. The method of embodiment 24, wherein the plasmonic mode has a mode size smaller than $\lambda/20$ in at least one dimension of the mode.

26. The method of embodiment 23, wherein the low-refraction index gap comprises a layer of material having a thickness that ranges between approximately 1 nm and approximately 100 nm.

27. The method of embodiment 26, wherein the low-refraction index gap comprises a layer of material having a thickness that ranges between approximately 2 nm and approximately 50 nm.

28. The method of embodiment 27, wherein the low-refraction index gap comprises a layer of material having a thickness that ranges between approximately 5 nm and approximately 10 nm.

29. The method of embodiment 23, wherein the electrical bias causes at least a portion of the electron carrier population to travel from the metal substrate through the low-refraction index gap to the semiconductor material.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A plasmon laser source, comprising:
a metal substrate;
a semiconductor material;
the semiconductor material being separated from a surface of the metal substrate by a low-refraction index gap; and
an electron pumping means;
wherein the electron pumping means is configured to excite an electron carrier population to generate a plasmonic laser emission from the low-refraction index gap;
wherein the plasmonic laser emission is confined by a plasmonic mode having a mode size smaller than a diffraction limit of light in at least one dimension.

2. A laser source as recited in claim 1, wherein at least a portion of the electron carrier population travel from the metal substrate through the low-refraction index gap to the semiconductor material.

3. A laser source as recited in claim 1, wherein the laser source supports a plasmonic mode having a mode size smaller than λ/2 in at least one dimension of the mode.

4. A laser source as recited in claim 3, wherein the laser source supports a plasmonic mode having a mode size smaller than λ/20 in at least one dimension of the mode.

5. A laser source as recited in claim 1, wherein the low-refraction index gap comprises a layer of material having a thickness that ranges between approximately 1 nm and approximately 100 nm.

6. A laser source as recited in claim 5, wherein the low-refraction index gap comprises a layer of material having a thickness that ranges between approximately 2 nm and approximately 50 nm.

7. A laser source as recited in claim 6, wherein the low-refraction index gap comprises a layer of material having a thickness that ranges between approximately 5 nm and approximately 10 nm.

8. A laser source as recited in claim 6, the laser source generates a plasmonic mode emission having a mode size confined to be smaller than 10 nm in at least one dimension.

9. A laser source as recited in claim 1, wherein the low-refraction index gap has an index of refraction between 1 and 2.

10. A laser source as recited in claim 9, wherein the semiconductor material has an index of refraction between 2.5 and 3.5.

11. A laser source as recited in claim 1, wherein the semiconductor material comprises a gain medium for amplifying light.

12. A laser source as recited in claim 1, further comprising:
a positive charge carrier layer disposed over at least a portion of the semiconductor material opposite from said low-refraction index gap;
wherein the positive charge carrier is configured to allow hole electrons to travel through the positive charge carrier layer to the semiconductor material.

13. A laser source as recited in claim 1, further comprising:
an electrode coupled to said hole injection layer;
wherein the electron pumping means comprises an electronic voltage source configured to apply an electrical bias across the electrode and the metal substrate.

14. A laser source as recited in claim 1, wherein the semiconductor material comprises a nanowire having a first dimension less than 150 nm.

15. A laser source as recited in claim 1:
wherein the semiconductor comprises a doped semiconductor,
wherein the electron pumping means comprises an electronic voltage source configured to apply an electrical bias across the doped semiconductor and the metal substrate;
the laser source comprising an MOS junction;
wherein the electrical bias is configured to generate an electron carrier inversion by biasing the MOS junction.

16. A laser source as recited in claim 1, wherein said laser source operates at room temperature.

17. A laser source as recited in claim 1, wherein said semiconductor gain material is configured to be selected from a plurality of different semiconductor materials to determine the wavelength of the plasmonic laser emission.

18. A laser source as recited in claim 1, wherein the said semiconductor gain material is comprises a planar structure configured to confine plasmonic laser emission in only one dimension.

19. A laser source as recited in claim 18, wherein said planar structure is sized to confine plasmonic laser emission in three dimensions.

20. A laser source as recited in claim 1, wherein said laser source has a loss, in loss/wavelength units, of between 0.0001-0.1.

21. A laser source as recited in claim 1, wherein the laser source is configured to support modulation speeds faster than 40 GHz.

22. A laser source as recited in claim 1, wherein the laser source is configured to support modulation speeds faster than 1 THz.

23. A method for generating a plasmonic laser emission, the plasmonic laser emission having a mode size smaller than the diffraction limit of light, the method comprising the steps of:
- generating an electrical bias across a metal substrate and a semiconductor material;
- the semiconductor material being separated from a surface of the metal substrate by a low-refraction index gap;
- exciting an electron carrier population within the semiconductor material; and
- generating the plasmonic emission from the low-refraction index gap.

24. A method as recited in claim 23, wherein the plasmonic mode has a mode size smaller than $\lambda/2$ in at least one dimension of the mode.

25. A method as recited in claim 24, wherein the plasmonic mode has a mode size smaller than $\lambda/20$ in at least one dimension of the mode.

26. A method as recited in claim 23, wherein the low-refraction index gap comprises a layer of material having a thickness that ranges between approximately 1 nm and approximately 100 nm.

27. A method as recited in claim 26, wherein the low-refraction index gap comprises a layer of material having a thickness that ranges between approximately 2 nm and approximately 50 nm.

28. A method as recited in claim 27, wherein the low-refraction index gap comprises a layer of material having a thickness that ranges between approximately 5 nm and approximately 10 nm.

29. A method as recited in claim 23, wherein the electrical bias causes at least a portion of the electron carrier population to travel from the metal substrate through the low-refraction index gap to the semiconductor material.

* * * * *